(12) United States Patent
Adusumilli et al.

(10) Patent No.: US 11,545,577 B2
(45) Date of Patent: Jan. 3, 2023

(54) SEMICONDUCTOR STRUCTURE WITH IN-DEVICE HIGH RESISTIVITY POLYCRYSTALLINE SEMICONDUCTOR ELEMENT AND METHOD

(71) Applicant: GLOBALFOUNDRIES U.S. Inc., Santa Clara, CA (US)

(72) Inventors: Siva P. Adusumilli, South Burlington, VT (US); John J. Ellis-Monaghan, Grand Isle, VT (US); Steven M. Shank, Jericho, VT (US); Yves T. Ngu, Hinesburg, VT (US); Michael J. Zierak, Colchester, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 23 days.

(21) Appl. No.: 17/114,554

(22) Filed: Dec. 8, 2020

(65) Prior Publication Data
US 2022/0181501 A1 Jun. 9, 2022

(51) Int. Cl.
*H01L 29/786* (2006.01)
*H01L 21/8234* (2006.01)
*H01L 21/02* (2006.01)
*H01L 29/04* (2006.01)

(52) U.S. Cl.
CPC .. *H01L 29/78672* (2013.01); *H01L 21/02595* (2013.01); *H01L 21/823412* (2013.01); *H01L 29/04* (2013.01)

(58) Field of Classification Search
CPC ...... G01N 33/2823; G01N 9/00; G01N 24/08; H01L 29/78672; H01L 21/02595; H01L 21/823412; H01L 29/04; H01L 27/0688; H01L 27/1203; H01L 27/0629
See application file for complete search history.

(56) References Cited

U.S. PATENT DOCUMENTS

| 4,104,086 A | 8/1978 | Bondur et al. |
| 4,470,062 A | 9/1984 | Muramatsu |
| 4,786,608 A | 11/1988 | Griffith |

(Continued)

FOREIGN PATENT DOCUMENTS

KR 20180033877 A * 4/2018

*Primary Examiner* — Edward Chin
(74) *Attorney, Agent, or Firm* — Francois Pagette; Hoffman Warnick LLC

(57) ABSTRACT

Disclosed is a structure including a semiconductor layer with a device area and, within the device area, a monocrystalline portion and polycrystalline portion(s) that extend through the monocrystalline portion. The structure includes an active device including a device component, which is in device area and which includes polycrystalline portion(s). For example, the device can be a field effect transistor (FET) (e.g., a simple FET or a multi-finger FET for a low noise amplifier or RF switch) with at least one source/drain region, which is in the device area and which includes at least one polycrystalline portion that extends through the monocrystalline portion. The embodiments can vary with regard to the type of structure (e.g., bulk or SOI), with regard to the type of device therein, and also with regard to the number, size, shape, location, orientation, etc. of the polycrystalline portion(s). Also disclosed is a method for forming the structure.

13 Claims, 22 Drawing Sheets

(56) References Cited

U.S. PATENT DOCUMENTS

| | | | |
|---|---|---|---|
| 4,983,226 A | | 1/1991 | Hunter et al. |
| 5,723,896 A | | 3/1998 | Yee et al. |
| 5,955,763 A | * | 9/1999 | Lin .................. H01L 29/41758 |
| | | | 257/365 |
| 6,096,621 A | | 8/2000 | Jennings |
| 6,258,688 B1 | | 7/2001 | Tsai |
| 6,489,211 B1 | * | 12/2002 | Freeman, Jr. ....... H01L 29/0649 |
| | | | 438/327 |
| 6,500,744 B2 | | 12/2002 | Gonzalez et al. |
| 6,833,322 B2 | | 12/2004 | Anderson et al. |
| 8,299,537 B2 | | 10/2012 | Greco et al. |
| 8,866,226 B2 | | 10/2014 | Botula et al. |
| 9,786,770 B1 | * | 10/2017 | John ................. H01L 21/26513 |
| 9,818,742 B2 | | 11/2017 | Larson |
| 9,917,104 B1 | * | 3/2018 | Roizin ................ H01L 27/2463 |
| 10,192,779 B1 | | 1/2019 | Shank et al. |
| 10,319,716 B2 | | 6/2019 | Moen et al. |
| 10,424,664 B2 | | 9/2019 | Ellis-Monaghan |
| 10,453,928 B2 | | 10/2019 | Kjar |
| 10,461,152 B2 | | 10/2019 | Stamper et al. |
| 10,580,893 B2 | | 3/2020 | Adusumilli et al. |
| 2005/0124089 A1 | * | 6/2005 | Gogoi ................. B81C 1/00293 |
| | | | 438/52 |
| 2010/0307246 A1 | * | 12/2010 | Fujii ..................... G01P 15/125 |
| | | | 73/514.16 |
| 2013/0181290 A1 | | 7/2013 | Hurwitz et al. |
| 2013/0320443 A1 | * | 12/2013 | Levin ................. H01L 29/4916 |
| | | | 257/E27.06 |
| 2019/0109222 A1 | * | 4/2019 | Liu ..................... H01L 29/7787 |
| 2019/0131438 A1 | | 5/2019 | McPartlin |
| 2020/0312961 A1 | * | 10/2020 | Then ............... H01L 21/823807 |
| 2020/0335526 A1 | * | 10/2020 | Nidhi .................. H01L 21/8258 |

\* cited by examiner

US 11,545,577 B2

SEMICONDUCTOR STRUCTURE WITH IN-DEVICE HIGH RESISTIVITY POLYCRYSTALLINE SEMICONDUCTOR ELEMENT AND METHOD

BACKGROUND

Field of the Invention

The present invention relates to semiconductor structures and, more particularly, to embodiments of a semiconductor structure with one or more in-device high resistivity polycrystalline semiconductor elements and a method of forming the semiconductor structure.

Description of Related Art

Integrated circuit (IC) designs for bulk semiconductor structures may include a buried high-resistivity polycrystalline semiconductor element, which is buried within a bulk semiconductor substrate so as to be aligned below an active device area. Such a buried high resistivity polycrystalline semiconductor element can reduce parasitic loss and harmonics. Additionally, integrated circuit (IC) designs for both bulk semiconductor structures and semiconductor-on-insulator structures may include high-resistivity polycrystalline semiconductor elements, which are not buried (e.g., which are in the upper portion of a bulk semiconductor substrate or within the semiconductor layer on an insulator layer above a semiconductor substrate) and which are specifically placed outside active device areas. The non-buried high resistivity polycrystalline semiconductor elements provide isolation between adjacent active device areas, function as passive devices outside active device areas or function as semiconductor fill shapes outside active devices areas.

SUMMARY

Disclosed herein are embodiments of a semiconductor structure with one or more in-device high resistivity polycrystalline semiconductor elements. The semiconductor structure can be either a bulk semiconductor structure or a semiconductor-on-insulator structure (e.g., a silicon-on-insulator (SOI) structure). In any case, the semiconductor structure can include a semiconductor layer, which has a first surface and a second surface opposite the first surface. The semiconductor layer can also have a device area adjacent to the second surface and, within the device area, a monocrystalline portion and one or more polycrystalline portions, which extend vertically through the monocrystalline portion from the second surface toward the first surface. The semiconductor structure can further include an active semiconductor device that has, amongst other features, a device component, which is within the device area of the semiconductor layer and which includes at least one polycrystalline portion that extends vertically through the monocrystalline portion. The embodiments of the semiconductor structure can vary with regard to the type of structure (e.g., bulk or SOI), with regard to the type of active semiconductor device therein, as well as with regard to the number, size, shape, location, orientation, etc. of the polycrystalline portion(s) within the active semiconductor device.

Also disclosed herein are method embodiments for forming the above-described semiconductor structure with one or more in-device high resistivity polycrystalline semiconductor elements. Specifically, the method can include providing a semiconductor layer, which has a first surface and a second surface opposite the first surface, and which initially has a monocrystalline structure. The semiconductor layer can be a bulk semiconductor substrate for the formation of a bulk semiconductor structure or a semiconductor layer on an insulator layer for the formation of a semiconductor-on-insulator structure (e.g., a silicon-on-insulator (SOI) structure). In any case, the method can further include processing the semiconductor layer (e.g., using a patterned amorphization process followed by a recrystallization anneal process, as discussed further in the detailed description section below) so that, within an active device area adjacent to the second surface, the semiconductor layer has a monocrystalline portion and one or more polycrystalline portions, which extend vertically through the monocrystalline portion from the second surface toward the first surface. The method can further include forming an active semiconductor device that includes, amongst other features, a device component, which is in the device area of the semiconductor layer and which includes at least one polycrystalline portion that extends vertically through the monocrystalline portion. The embodiments of the method can vary with regard to the type of structure (e.g., bulk or SOI) formed, with regard to the type of active semiconductor device formed, as well as with regard to the number, size, shape, location, orientation, etc. of the polycrystalline portion(s) formed within the active semiconductor device.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 3A-1 to 3A-3 and 3B-1 to 3B-3 are cross-section view diagrams of the semiconductor structure of FIG. 3 as a bulk semiconductor structure or a semiconductor-on-insulator structure, respectively;

FIGS. 4A-1 to 4A-2 and 4B-1 to 4B-2 are cross-section view diagrams of the semiconductor structure of FIG. 4 as a bulk semiconductor structure or a semiconductor-on-insulator structure, respectively;

FIGS. 5A-1 to 5A-3 and 5B-1 to 5B-3 are cross-section view diagrams of the semiconductor structure of FIG. 5 as a bulk semiconductor structure or a semiconductor-on-insulator structure, respectively;

DETAILED DESCRIPTION

Figure 1:
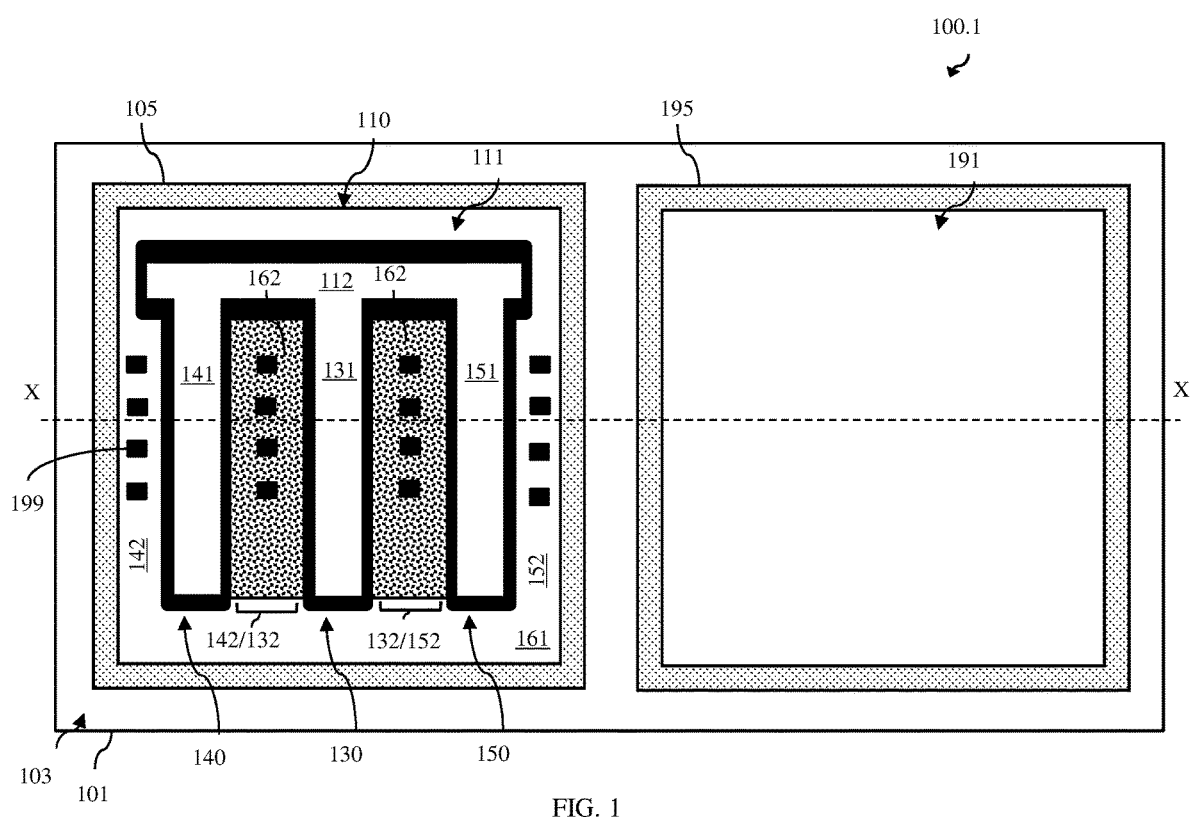
FIG. 1 is top-view diagram of a semiconductor structure with one or more in-device high resistivity polycrystalline semiconductor elements.

As mentioned above, integrated circuit (IC) designs for bulk semiconductor structures may include a buried high-resistivity polycrystalline semiconductor element, which is buried within a bulk semiconductor substrate so as to be aligned below an active device area in an upper portion of the substrate. Such a buried high resistivity polycrystalline semiconductor element can reduce parasitic loss and harmonics. Additionally, integrated circuit (IC) designs for both bulk semiconductor structures and semiconductor-on-insulator structures may include high-resistivity polycrystalline semiconductor elements, which are not buried (e.g., which are in the upper portion of a bulk semiconductor substrate or within the semiconductor layer on an insulator layer above a semiconductor substrate) and which are specifically placed outside active device areas. The non-buried high resistivity polycrystalline semiconductor elements provide isolation between adjacent active device areas, function as passive devices outside active device areas or function as semiconductor fill shapes outside active device areas. For purposes of this disclosure, an active device area is an area of a semiconductor structure that contains one or more active semiconductor devices (e.g., transistors or other active semiconductor devices, etc.). The inventors of the disclosed embodiments have discovered that performance benefits may also be derived from selectively placed high-resistivity polycrystalline semiconductor elements within active semiconductor devices.

Thus, disclosed herein are embodiments of a semiconductor structure with one or more in-device high resistivity polycrystalline semiconductor elements. The semiconductor structure can be either a bulk semiconductor structure or a semiconductor-on-insulator structure (e.g., a silicon-on-insulator (SOI) structure). In any case, the semiconductor structure can include a semiconductor layer, which has a first surface and a second surface opposite the first surface. The semiconductor layer can also have a device area adjacent to the second surface and, within the device area, a monocrystalline portion and one or more polycrystalline portions, which extend vertically through the monocrystalline portion from the second surface toward the first surface. The semiconductor structure can further include an active semiconductor device. The active semiconductor device can include, amongst other features, a device component within the device area of the semiconductor layer and including at least one polycrystalline portion that extends vertically through the monocrystalline portion. The embodiments of the semiconductor structure can vary with regard to the type of structure (e.g., bulk or SOI), with regard to the type of active semiconductor device therein, as well as with regard to the number, size, shape, location, orientation, etc. of the polycrystalline portion(s) within the active semiconductor device. Also disclosed herein are method embodiments for forming such a semiconductor structure.

It should be noted that the active semiconductor device of the disclosed semiconductor structure embodiments could be any type of active semiconductor device that might benefit from incorporation of one or more in-device high resistivity polycrystalline semiconductor element within one or more of its components. For example, the active semiconductor device could be a field effect transistor (FET) with at least one source/drain region, which is in the device area of the semiconductor layer and which includes at least one polycrystalline portion that extends through the monocrystalline portion of the device area. This FET could be any type of FET ranging from a simple FET to a more complex FET, such as the multi-finger FET of a low noise amplifier (LNA) or a radio frequency (RF) switch. Polycrystalline portion(s) in a source/drain region of a FET can be employed, for example, to reduce the body effect time constant (e.g., in the case of an LNA) or to reduce harmonics (e.g., in the case of an RF switch). For purposes of illustration, semiconductor structure embodiments are described below and illustrated in the drawings with respect to a multi-finger FET. For purposes of this disclosure, a multi-finger FET refers to a complex FET that includes: alternating source/drain regions and channel regions within a semiconductor layer such that each channel region is positioned laterally between two source/drain regions; and a gate structure with multiple parallel gate structures (referred to as fingers, gate fingers, etc.) traversing the channel regions and an additional gate structure above an isolation region and perpendicular to and in contact with one end of each of the parallel gate structures. However, it should be understood that, alternatively, the active semiconductor device of the disclosed semiconductor structure could be any other type of active semiconductor device with at least one device component, which is in the device area of the semiconductor layer and which includes at least one polycrystalline portion that extends through the monocrystalline portion of the device area.

FIGS. 1, 2, 3, 4 and 5 are top down diagrams illustrating exemplary embodiments of the disclosed semiconductor structure 100.1, 100.2, 100.3, 100.4 and 100.5, respectively, each including a semiconductor layer 101 (e.g., a layer of silicon or a layer of some other suitable semiconductor material).

Figure 1A:
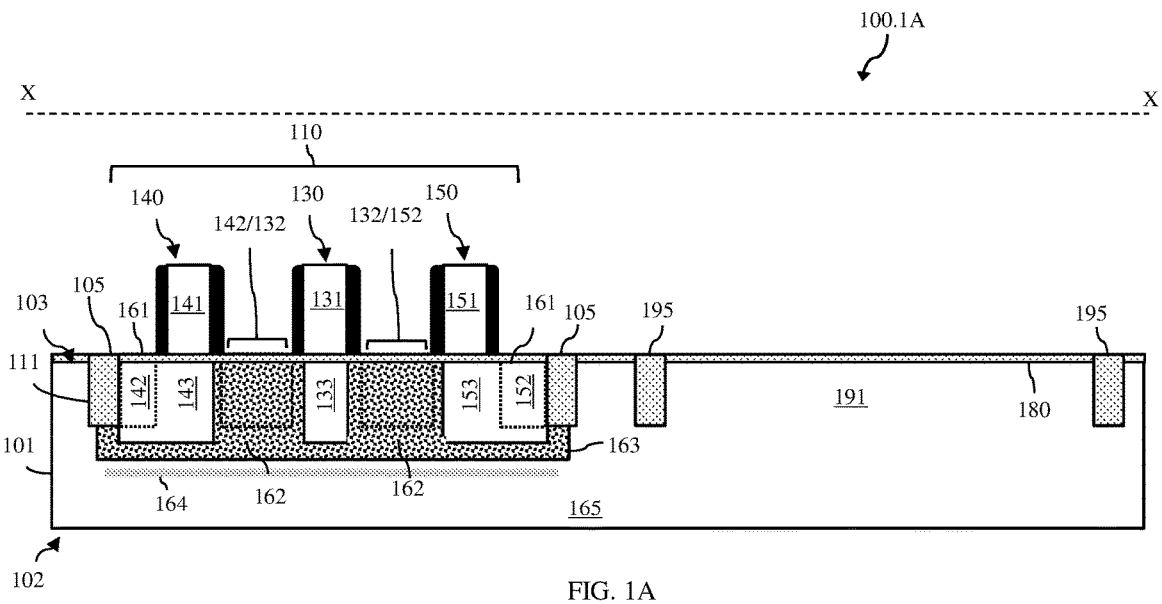
FIGS. 1A and 1B are cross-section view diagrams of the semiconductor structure of FIG. 1 as a bulk semiconductor structure or a semiconductor-on-insulator structure, respectively.
Figure 2:
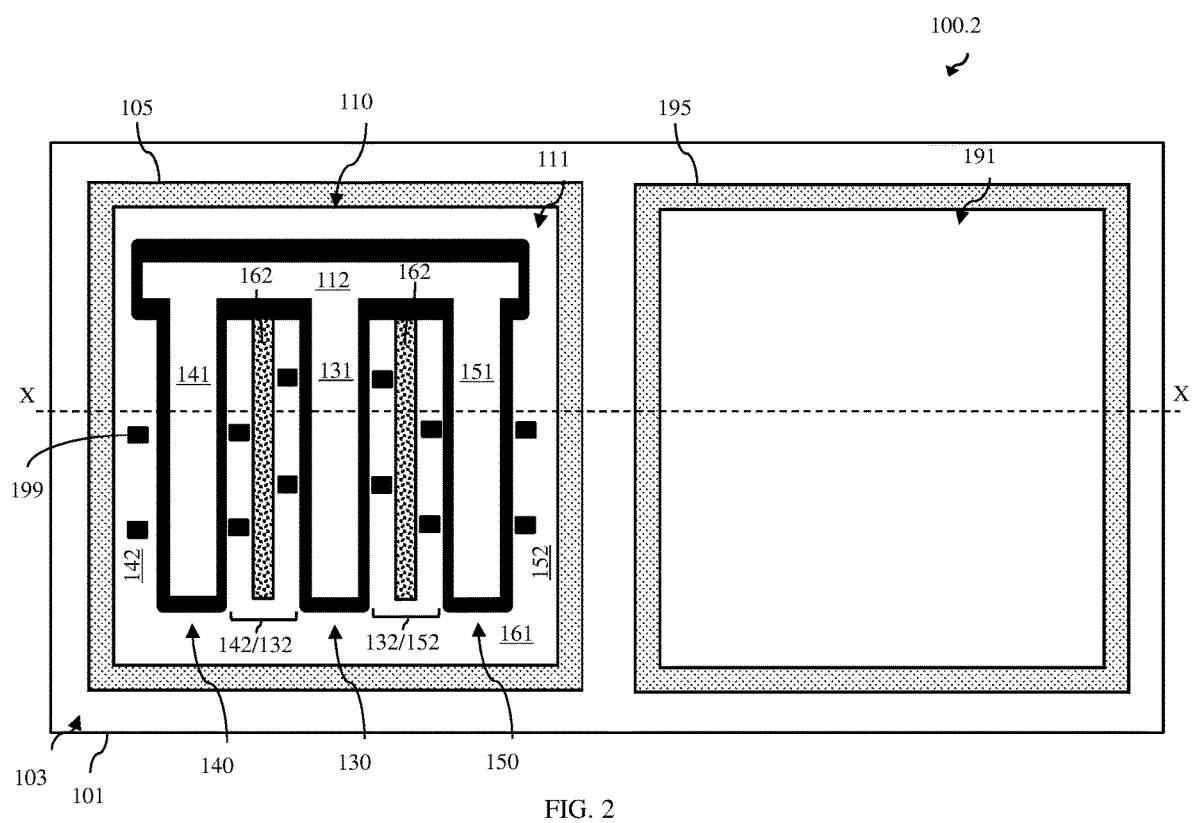
FIG. 2 is top-view diagram of a semiconductor structure with one or more in-device high resistivity polycrystalline semiconductor elements.
Figure 2A:
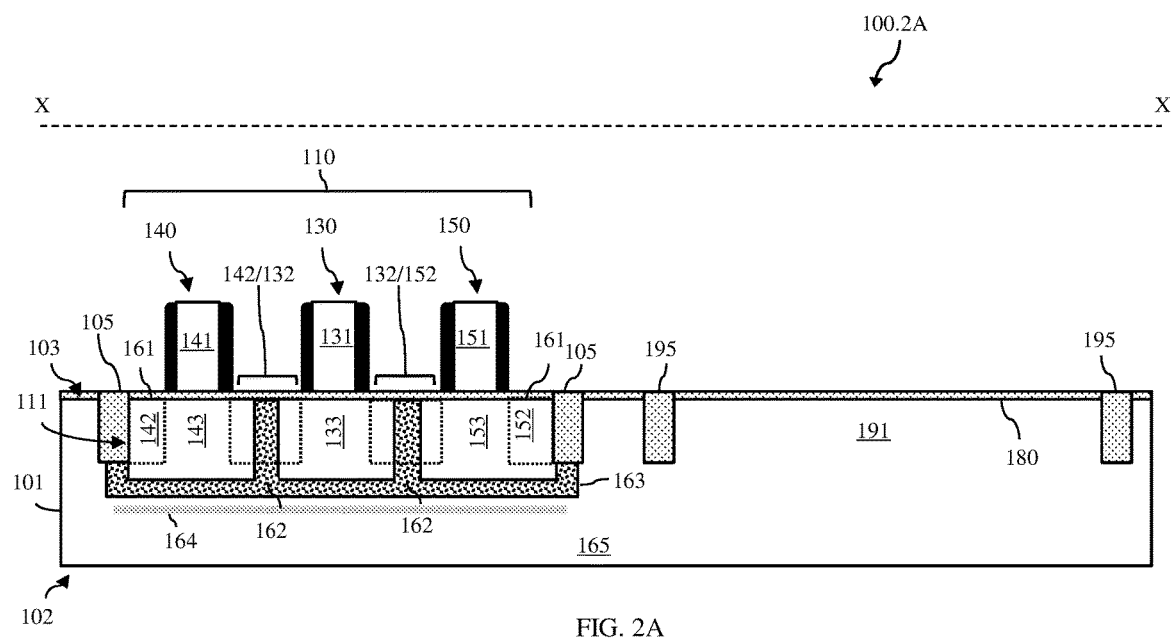
FIGS. 2A and 2B are cross-section view diagrams of the semiconductor structure of FIG. 2 as a bulk semiconductor structure or a semiconductor-on-insulator structure, respectively.
Figure 3:
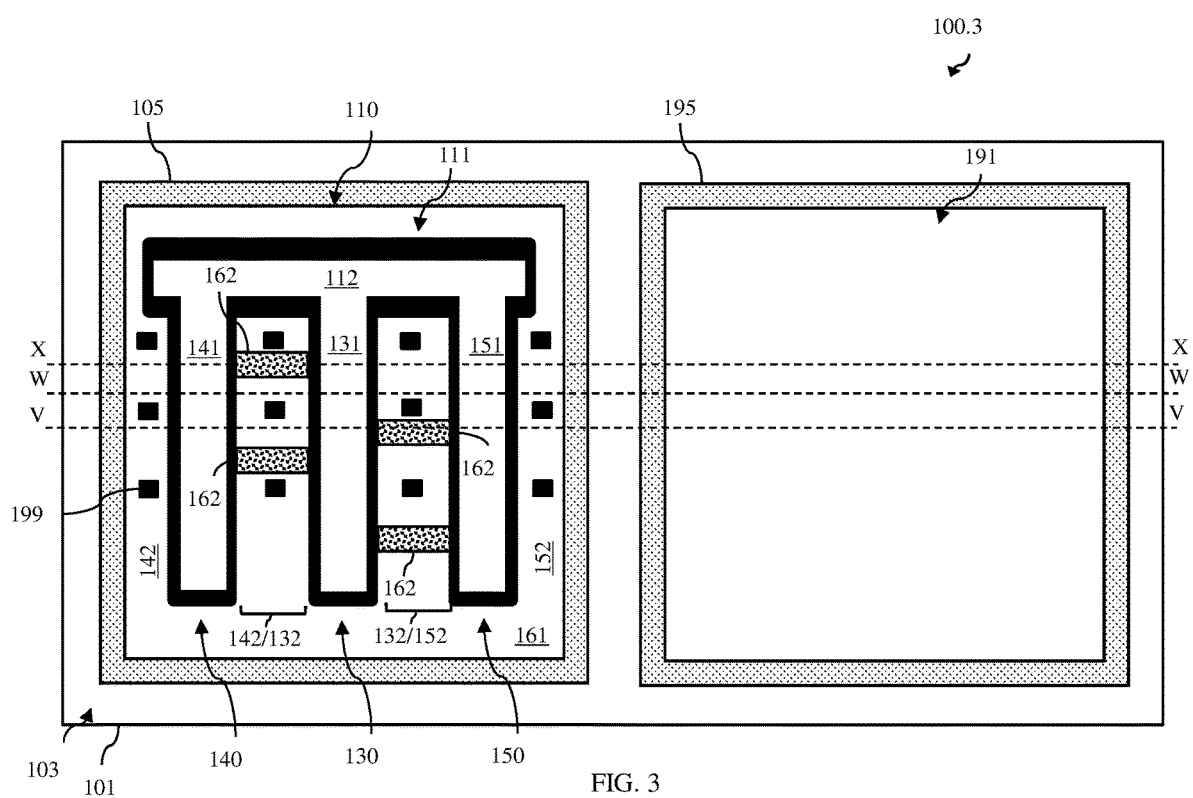
FIG. 3 is top-view diagram of a semiconductor structure with one or more in-device high resistivity polycrystalline semiconductor elements.
Figures 1, 3A:
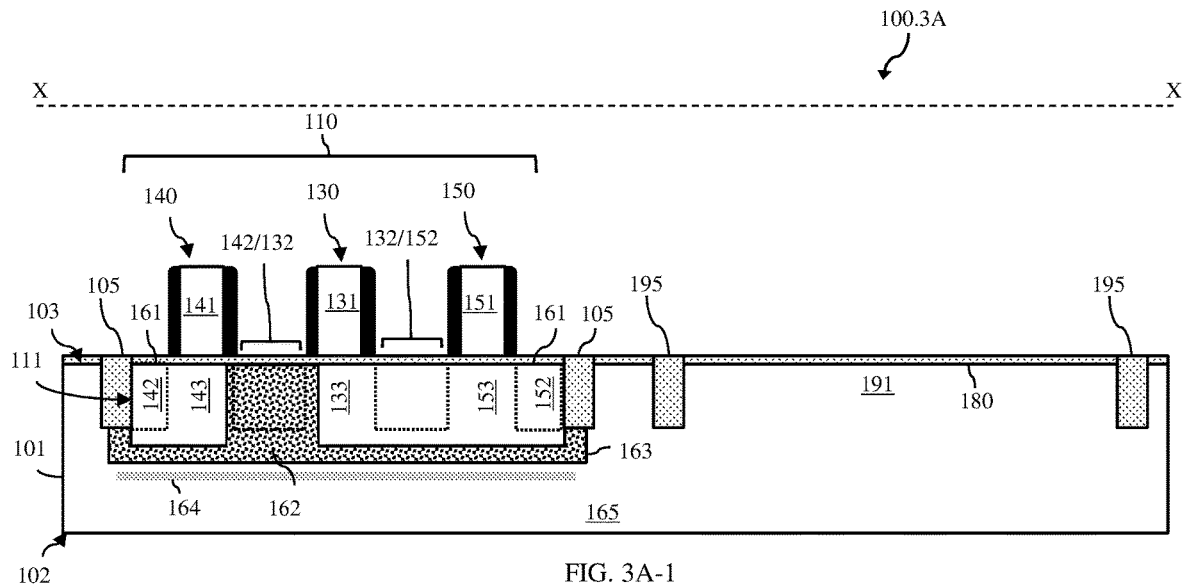
Figures 2, 3A:
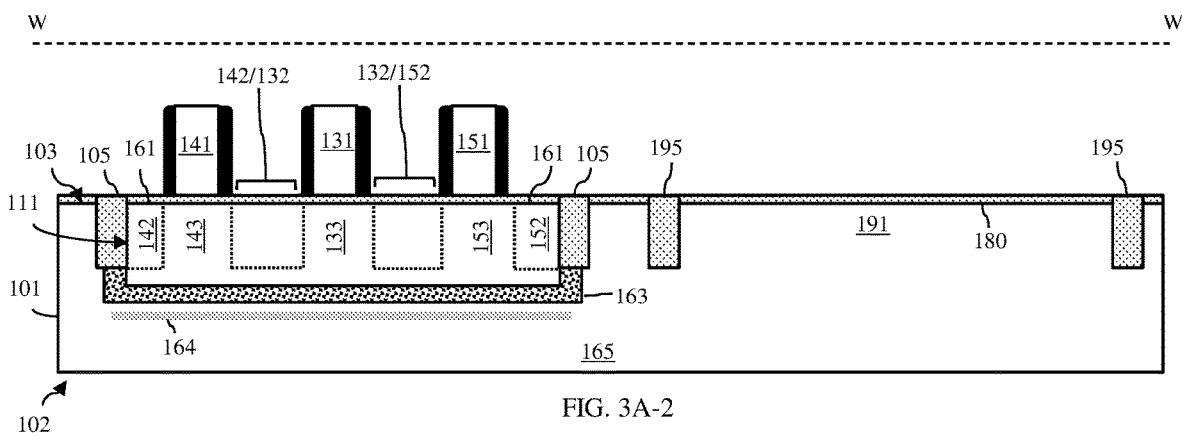
Figures 3, 3A:
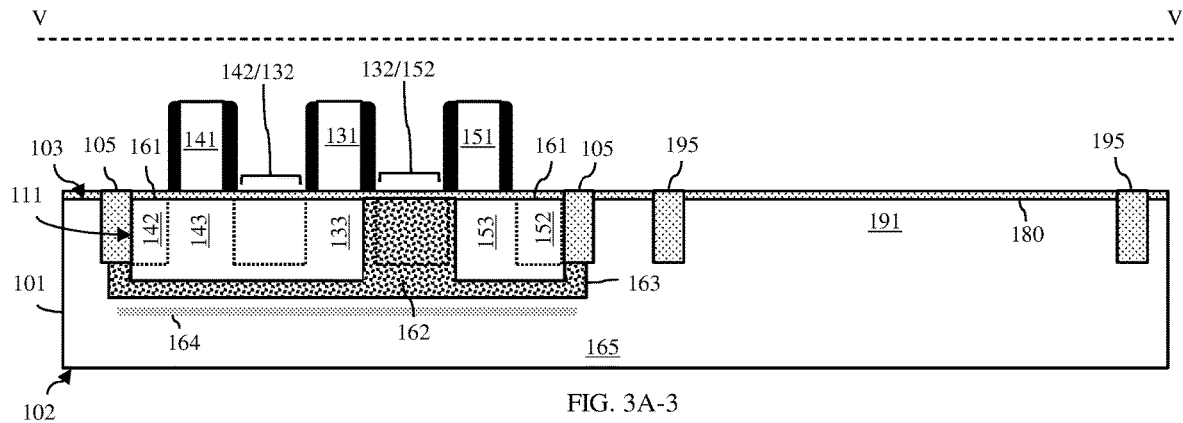
Figure 4:
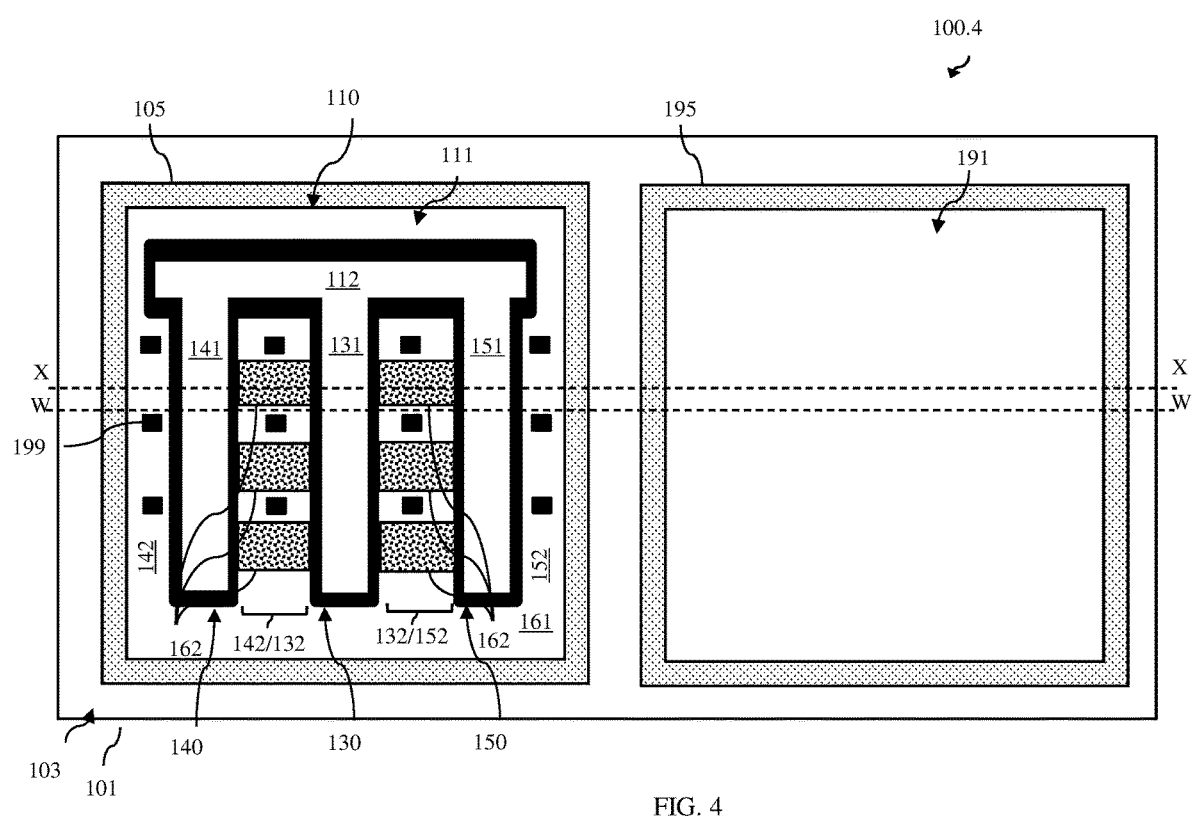
FIG. 4 is top-view diagram of a semiconductor structure with one or more in-device high resistivity polycrystalline semiconductor elements.
Figures 1, 4A:
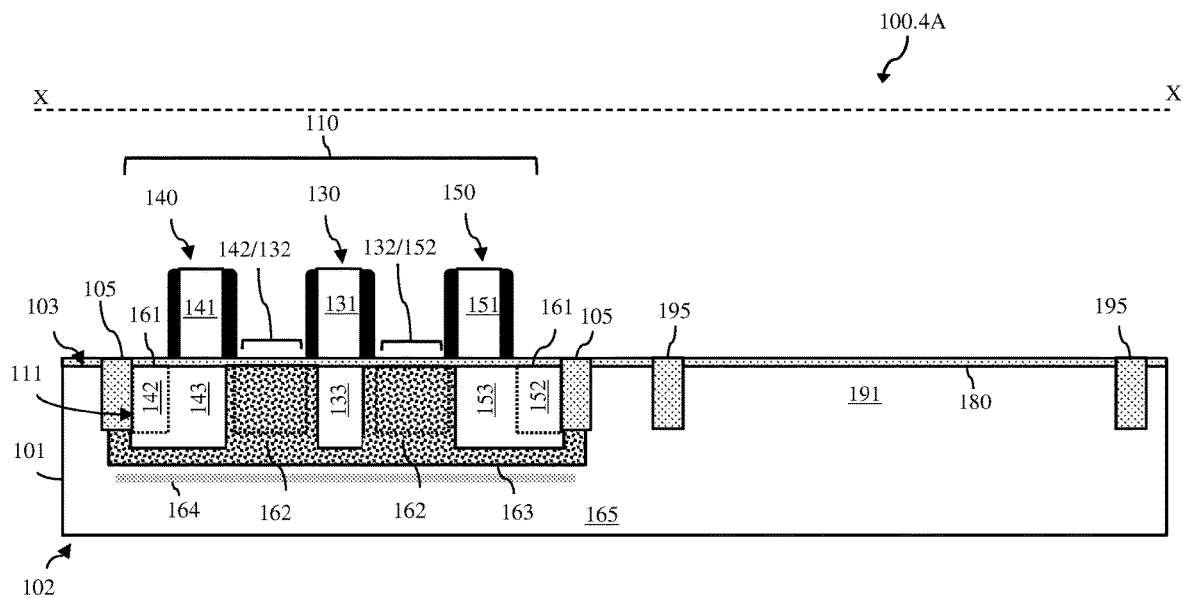
Figures 2, 4A:
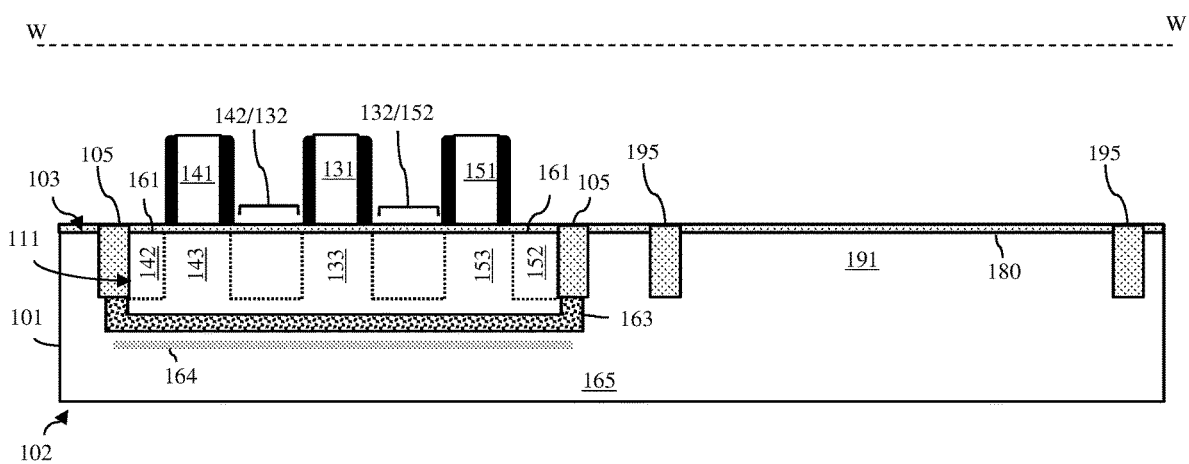

In some embodiments, the semiconductor structure 100.1-100.5 can be a bulk semiconductor structure (see the semiconductor structure 100.1A shown in the XX cross-section of FIG. 1A; see the semiconductor structure 100.2A shown in the XX cross-section diagram of FIG. 2A; see the semiconductor structure 100.3A shown in the XX, WW, and VV cross-section diagrams of FIGS. 3A-1, 3A-2 and 3A-3, respectively; see the semiconductor structure 100.4A shown in the XX and WW cross-section diagrams of FIGS. 4A-1 and 4A-2, respectively; and see the semiconductor structure 100.5A shown in the XX, WW, and VV cross-section diagrams of FIGS. 5A-1, 5A-2 and 5A-3, respectively). In this case, the semiconductor layer 101 can be a bulk semiconductor substrate (e.g., a bulk silicon substrate) with a bottom surface 102 (referred to herein as a first surface) and a top surface 103 (referred to herein as a second surface) opposite and parallel to the bottom surface 102.

Figure 1B:
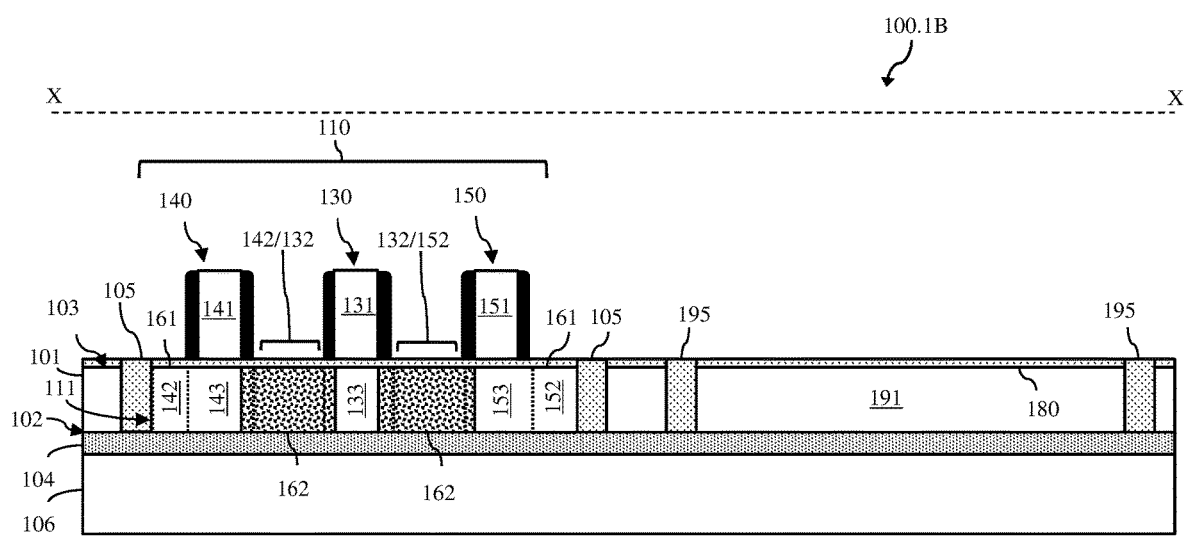
Figure 2B:
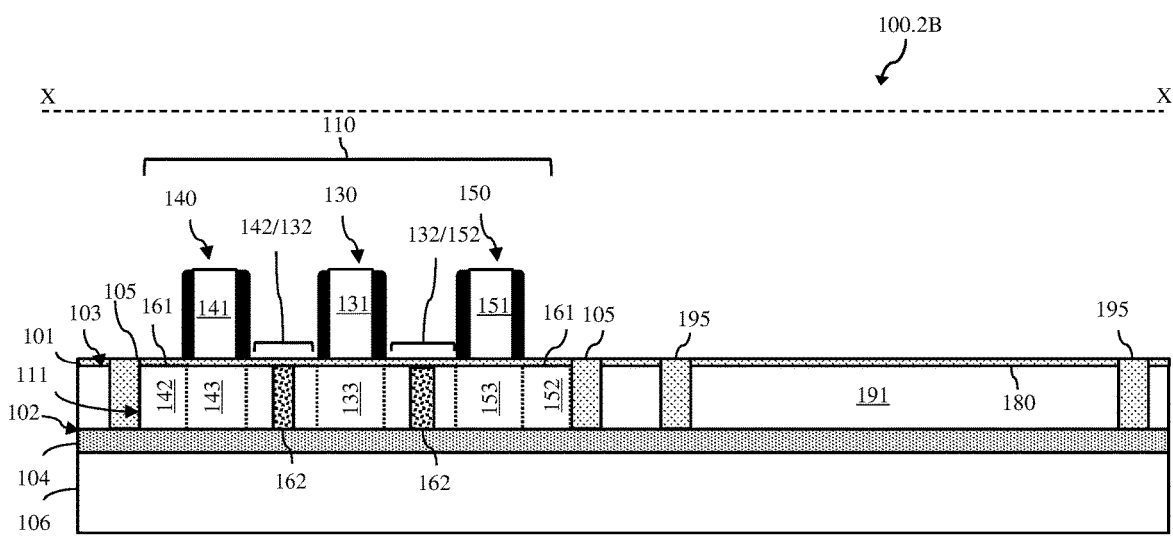
Figures 1, 3B:
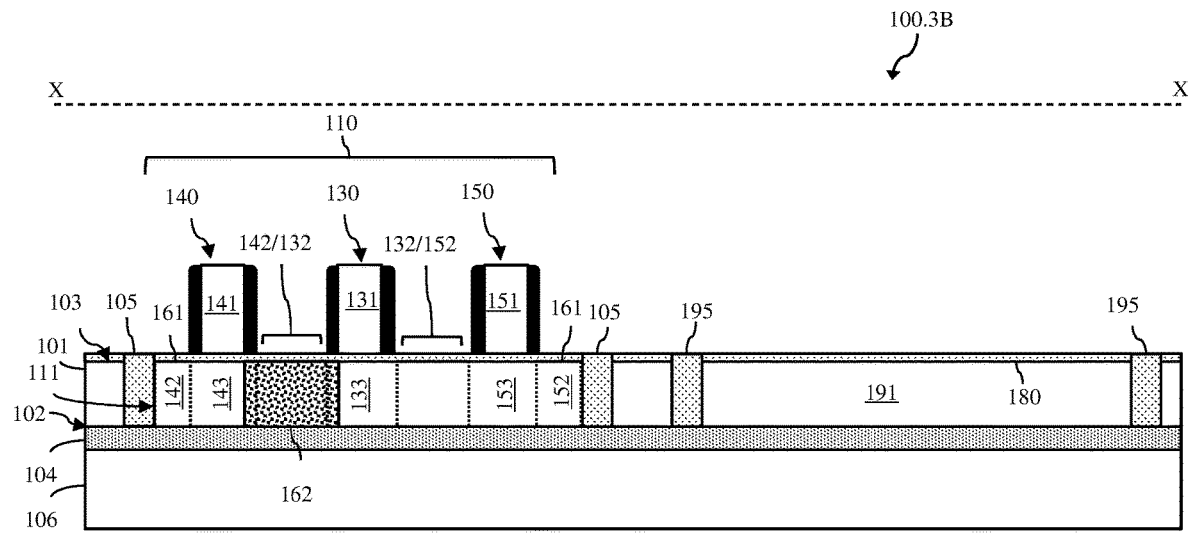
Figures 2, 3B:
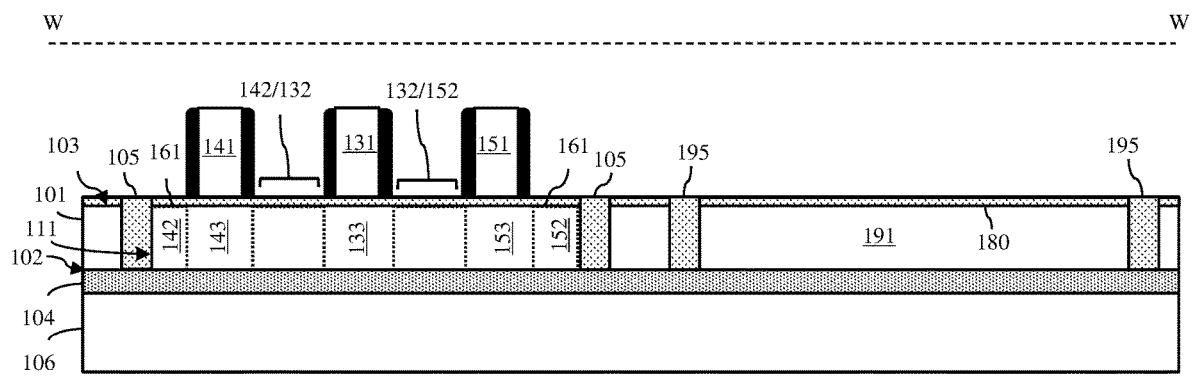
Figures 3, 3B:
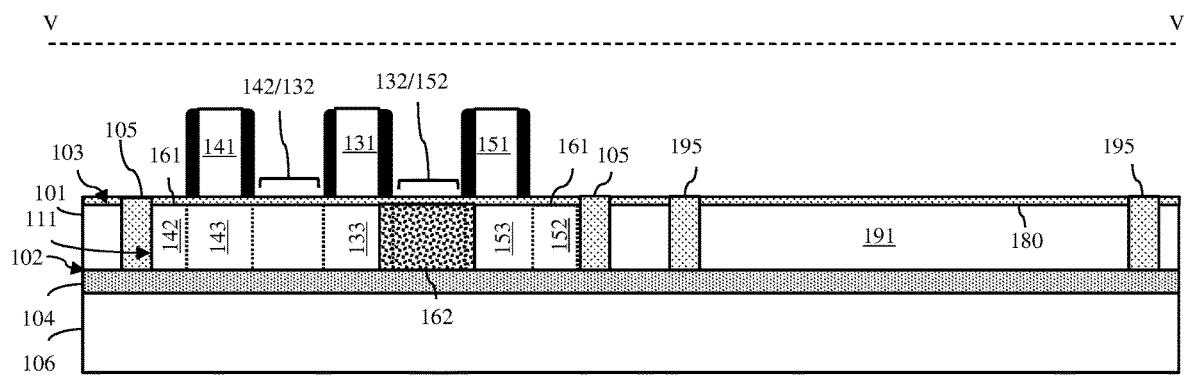
Figures 1, 4B:
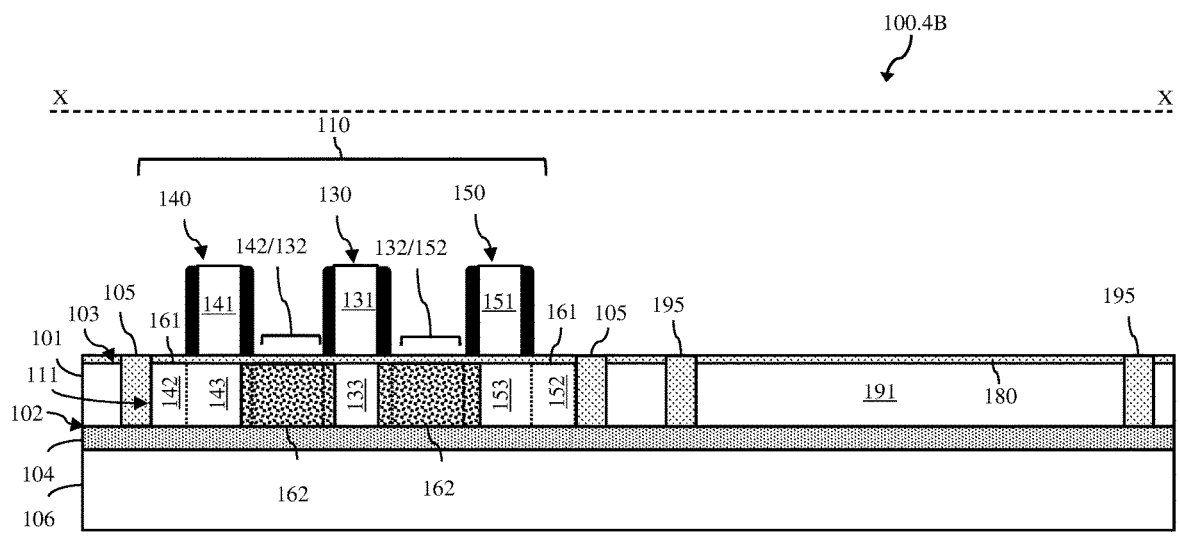
Figures 2, 4B:
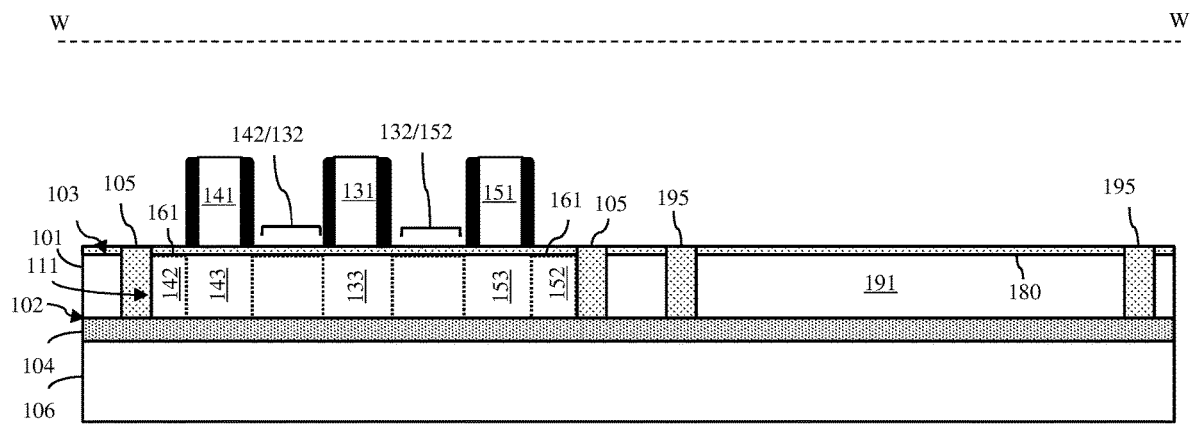

In other embodiments, the semiconductor structure 100.1-100.5 can be a semiconductor-on-insulator structure, such as a silicon-on-insulator (SOI) structure (see the semiconductor structure 100.1B shown in the XX cross-section of FIG. 1B; see the semiconductor structure 100.2B shown in the XX cross-section diagram of FIG. 2B; see the semiconductor structure 100.3B shown in the XX, WW, and VV cross-section diagrams of FIGS. 3B-1, 3B-2 and 3B-3, respectively; see the semiconductor structure 100.4B shown in the XX and WW cross-section diagrams of FIGS. 4B-1 and 4B-2, respectively; and see the semiconductor structure 100.5B shown in the XX, WW, and VV cross-section diagrams of FIGS. 5B-1, 5B-2 and 5B-3, respectively). In this case, the semiconductor layer 101 can be, for example, a silicon layer with a bottom surface 102 (referred to herein as a first surface) and a top surface 103 (referred to herein as a second surface) opposite and parallel to the bottom surface 102. The bottom surface 102 of the semiconductor layer 101 can be above and immediately adjacent to a buried insulator layer 104 (e.g., a buried silicon dioxide layer, also referred to herein as a BOX layer). Furthermore, the buried insulator layer 104 can be above and immediately adjacent to the top surface of a substrate 106 (e.g., a silicon substrate or some other suitable substrate).

Regardless of whether the semiconductor structure 100.1-100.5 is a bulk semiconductor structure 100.1A-100.5A or a semiconductor-on-insulator structure 100.1B-100.5B, it can include trench isolation regions 105. The trench isolation regions 105 can be, for example, shallow trench isolation (STI) regions. That is, the trench isolation regions 105 can include trenches, which extend vertically into the semiconductor layer 101 from the top surface 103 and which are filled with one or more layers of isolation material (e.g., silicon dioxide or any other suitable isolation material). The trench isolation regions 105 can be formed (e.g., the trenches can be lithographically patterned and etched and then filled with isolation material) so as to define the boundaries of an active device area 111 in the semiconductor layer 101. For example, the active device area 111 can extend laterally between the trench isolation regions 105. Furthermore, the trench isolation regions 105 can be formed so as to electrically isolate that active device area 111 from other areas of the semiconductor layer 101. In the case of a bulk semiconductor structure 100.1A-100.5A (as shown in FIG. 1A, FIG. 2A, FIGS. 3A-1, 3A-2 and 3A-3, FIGS. 4A-1 and 4A-2, and FIGS. 5A-1, 5A-2 and 5A-3), the trench isolation region 105 can extend from the top surface 103 some predetermine distance into the semiconductor substrate (e.g., through an upper portion of the semiconductor substrate). In the case of a semiconductor-on-insulator structure 100.1B-100.5B (as shown in FIG. 1B, FIG. 2B, FIGS. 3B-1, 3B-2 and 3B-3, FIGS. 4B-1 and 4B-2, and FIGS. 5B-1, 5B-2 and 5B-3), the trench isolation region 105 can extend completely through the semiconductor layer 101 from the top surface 103 to the bottom surface 102 (i.e., to the top surface of the insulator layer 104).

In any case, the semiconductor layer 101 can have, within the active device area 111, a monocrystalline portion 161 and one or more polycrystalline portions 162 (also referred to herein as in-device high-resistivity polycrystalline semiconductor elements), which extend vertically through the monocrystalline portion 161 from the top surface 103 toward or to the bottom surface 102.

For example, in the case of a bulk semiconductor structure 100.1A-100.5A (as shown in FIG. 1A, FIG. 2A, FIGS. 3A-1, 3A-2 and 3A-3, FIGS. 4A-1 and 4A-2, and FIGS. 5A-1, 5A-2 and 5A-3), the monocrystalline portion 161 of the active device area 111 can extend laterally from one trench isolation region 105 to another and the polycrystalline portion(s) 162 can extend vertically through the monocrystalline portion 161. The semiconductor layer 101 (in this case the semiconductor substrate) can also include an additional monocrystalline portion 165 at the bottom surface 102 (i.e., in the lower portion of the substrate) and a buried polycrystalline portion 163 (also referred to herein as buried high-resistivity polycrystalline semiconductor element) in the middle of the substrate between the additional monocrystalline portion 165 and the monocrystalline portion 161 of the active device area 111. The monocrystalline portion 161 of the active device area 111 can extend downward from the top surface 103 to the top of the buried polycrystalline portion 163. The polycrystalline portion(s) 162 can extend downward from the top surface 103 and can merge with the buried polycrystalline portion 163. It should be noted that the bottom of the buried polycrystalline portion 163 is illustrated in the drawings as being essentially planar. However, due to formation techniques discussed in greater detail below with regard to the method, the depth of the bottom of the buried polycrystalline portion 163 may be greater below the monocrystalline portion 161 than it is below the polycrystalline portion(s) 162.

It should be noted that the buried polycrystalline portion 163 can also extend laterally between and can contact the trench isolation regions 105 that surround the active device area 111. It should be noted that the trench isolation regions 105 can extend a first depth into the semiconductor layer (i.e., the top surface 103 of the semiconductor layer 101 and the bottom surfaces of the trench isolation regions 105 can be separated by a first distance) and the monocrystalline portion 161 can extend a second depth into the semiconductor layer (i.e., the top surface 103 of the semiconductor layer 101 and the bottom surface of the monocrystalline portion 161 at the interface with the buried polycrystalline portion 163 can be separated by a second distance). In some embodiments, the first depth (i.e., the first distance) can be less than the second depth (i.e., the second distance), as shown in the figures. In this case, the buried polycrystalline portion may have a horizontal portion and also vertical portions, which are at the outer edges of the horizontal portion and which extend upward to contact the trench isolation regions 105 and, thereby isolate the active device area 111. In other embodiments, the first depth (i.e., the first distance) can be the same or greater than the second depth (i.e., the second distance) (not shown).

Similarly, in the case of a semiconductor-on-insulator structure 100.1B-100.5B (as shown in FIG. 1B, FIG. 2B, FIGS. 3B-1, 3B-2 and 3B-3, FIGS. 4B-1 and 4B-2, and FIGS. 5B-1, 5B-2 and 5B-3), the monocrystalline portion 161 of the active device area 111 can extend laterally from one trench isolation region 105 to another and the polycrystalline portion(s) 162 can extend vertically through the monocrystalline portion 161. In this case, both the monocrystalline portion 161 and the polycrystalline portion(s) 162 can extend from the top surface 103 of the semiconductor layer 101 to the bottom surface 102 (i.e., to the insulator layer 104).

The semiconductor structure 100.1-100.5 can further include at least one active semiconductor device 110 and this active semiconductor device 110 can include at least one device component within the device area 111 such that it includes at least one polycrystalline portion 162 (i.e., at least one high-resistivity polycrystalline element) extending therethrough. As mentioned above, the active semiconductor device 110 could be any type of active semiconductor device that might benefit from incorporation of one or more in-device high resistivity polycrystalline semiconductor element within one or more of its components. However, for purposes of illustration, each semiconductor structure 100.1-100.5 is shown in the figures and described below as including a multi-finger FET and, particularly, a three-finger FET. It should be noted that a multi-finger FET could, alternatively, have any number of two or more fingers.

The multi-finger FET can include, within the active device area 111 laid out across the monocrystalline portion 161 (which as mentioned above has one or more polycrystalline portions extending therethrough), alternating source/drain regions and channel regions with each channel region for each FET section positioned laterally between two source/drain regions. It should be noted that, for purposes of this disclosure, each source/drain region that is positioned laterally between the channel regions of adjacent FET sections within a multi-finger FET is referred to herein as a "shared source/drain region". Thus, as illustrated, in the three-finger FET, there are three FET sections 130, 140, 150 and the device area 111 contains the following: a first body for the first FET section 130, where the first body includes a first channel region 133 positioned laterally between first source/drain regions 132; a second body for the second FET 140, where the second body includes a second channel region 143 positioned laterally between second source/drain regions 142; a third body for the third FET 150, where the third body includes a third channel region 153 positioned laterally between third source/drain regions 152. Furthermore, adjacent FET sections 130 and 140 have a shared source/drain region 142/132 (that includes one of the first source/drain regions 132 abutting one of the second source/drain regions 142) between their respective channel regions 133 and 143 and adjacent FET sections 130 and 150 have a shared source/drain region 132/152 (that includes the other one of the first source/drain regions 132 abutting one of the third source/drain regions 152) between their respective first and third channel regions 133 and 153.

The multi-finger FET can be, for example, an N-type FET (NFET) or a P-type FET (PFET). Those skilled in the art will recognize that, for NFETs, the source/drain regions will typically be N+ source/drain regions (i.e., source/drain regions doped so as to have N-type conductivity at a relatively high conductivity level) and the channel region will be a P− channel region (i.e., a channel region doped so as to have P-type conductivity at a relatively low conductivity level) or, alternatively, undoped (i.e., an intrinsic channel region). For PFETs, the source/drain regions will typically be P+ source/drain regions (i.e., source/drain regions doped so as to have P-type conductivity at a relatively high conductivity level) and the channel region will be a N− channel region (i.e., a channel region doped so as to have N-type conductivity at a relatively low conductivity level) or, alternatively, undoped (i.e., an intrinsic channel region). In any case, the source/drain regions can be dopant implant regions with a well region and the channel region can be a portion of the well region that lies between the source/drain regions. Optionally, each FET can have one or more additional components within their respective bodies (e.g., source/drain extension regions, halos, etc.). Such components are well-known in the art and, thus, the details thereof have been omitted from this specification in order to allow the reader to focus on the salient aspects of the disclosed embodiments.

The multi-finger FET can further have a multi-finger gate, which in this case includes three parallel gate structures (also referred to as gate fingers) on their corresponding channel regions and gate sidewall spacers positioned laterally adjacent to opposing sidewalls of the gate structures. For example, the first FET section 130 can have a first gate structure 131 on the first channel region 133, the second FET section 140 can have a second gate structure 141 on the second channel region 143 and the third FET section 150 can have a third gate structure 151 on the third channel region 153. These gate structures can be, for example, gate-first gate structures (e.g., polysilicon gate structures) or replacement metal gate (RMG) structures. The three-finger gate can also include an additional gate structure 112, which is on the trench isolation region 105 to one side of the device area 111 and which is in contact with one end of each of the three parallel-gate structures. Such a three-finger gate enables a gate voltage to be concurrently applied to the parallel gate structures. Gate structures as described above, including the local interconnect or gate extension that electrically connects them, are well known in the art and, thus, the details have been omitted form this specification in order to allow the reader to focus on the salient aspects of the disclosed embodiments.

In some embodiments, polycrystalline portion(s) (i.e., high-resistivity polycrystalline semiconductor elements) can be included in one or more of the source/drain regions of a FET. For example, in some embodiments, the multi-finger FET can be a low noise amplifier (LNA). In an LNA, polycrystalline portion(s) (i.e., high-resistivity polycrystalline semiconductor elements) can be included, for example, within one or both of the shared source/drain regions (142/132, 132/152) to reduce the body effect time constant. In other embodiments, the multi-finger FET can be a radio frequency (RF) switch. In an RF switch, polycrystalline portion(s) (i.e., high-resistivity polycrystalline semiconductor elements) can be included, for example, within one or both of the shared source/drain regions (142/132, 132/152) to reduce harmonics.

As mentioned above, embodiments can vary with regard to the type of structure (e.g., bulk or SOI) and with regard to the type of active semiconductor device incorporated into the structure. Embodiments can also vary with regard to the number, size, shape, location, orientation, etc. of the polycrystalline portion(s) 162 within the active semiconductor device.

For example, in the semiconductor structure 100.1 of FIG. 1 and, more specifically, in the bulk semiconductor structure 100.1A of FIG. 1A and also in the semiconductor-on-insulator structure 100.1B of FIG. 1B, the semiconductor layer 101 can have, within the active device area 111, one or more polycrystalline portions 162 including a polycrystalline portion 162 that extends vertically through the monocrystalline portion 161 in the shared source/drain region 142/132 and/or another polycrystalline portion 162 that extends vertically through the monocrystalline portion 161 in the shared source/drain region 132/152. Each polycrystalline portion 162 can have a length, which is measured in a direction perpendicular to the gate structures and which is approximately equal to the distance between the adjacent channel regions. Each polycrystalline portion 162 can further have a width, which is measured in a direction parallel to the gates and which is approximately equal to or greater than the width of the shared source/drain region such that the polycrystalline portion 162 traverses the full length and width of the shared source/drain region. Thus, in this semiconductor structure 100.1, each polycrystalline portion 162 completely encompasses a corresponding shared source/drain region.

For example, in the semiconductor structure 100.2 of FIG. 2 and, more specifically, in the bulk semiconductor structure 100.2A of FIG. 2A and also in the semiconductor-oninsulator structure 100.2B of FIG. 2B, the semiconductor layer 101 can have, within the active device area 111, one or more polycrystalline portions 162 including a polycrystalline portion 162 that extends vertically through the monocrystalline portion 161 in the shared source/drain region 142/132 and/or another polycrystalline portion 162 that extends vertically through the monocrystalline portion 161 in the shared source/drain region 132/152. Each polycrystalline portion 162 can be parallel to the gate structures. Each polycrystalline portion 162 can have a length, which is measured in a direction perpendicular to the gate structures and which is less than a distance between the adjacent channel regions. Each polycrystalline portion 162 can further have a width, which is measured in a direction parallel to the gates and which is, optionally, equal to or greater than the width of the shared source/drain region such that the polycrystalline portion 162 traverses the full width of the shared source/drain region. Each polycrystalline portion 162 can further be located in a center portion of the shared source/drain region (e.g., approximately halfway between the adjacent channel regions) such that it essentially bisects the shared source/drain region.

For example, in the semiconductor structure 100.3 of FIG. 3 and, more specifically, in the bulk semiconductor structure 100.3A of FIGS. 3A-1 to 3A-3 and also in the semiconductor-on-insulator structure 100.3B of FIGS. 3B-1 to 3B-3, the semiconductor layer 101 can have, within the active device area 111, one or more polycrystalline portions 162 including one or more polycrystalline portions 162 that extend vertically through the monocrystalline portion 161 in the shared source/drain region 142/132 and/or one or more polycrystalline portions 162 that extend vertically through the monocrystalline portion 161 in the shared source/drain region 132/152. Each polycrystalline portion 162 can have a length, which is measured in a direction perpendicular to the gate structures and which is approximately equal to the distance between the adjacent channel regions. Each polycrystalline portion 162 can further have a width, which is measured in a direction parallel to the gates and which is less than the width of the shared source/drain region such that the polycrystalline portion 162 does not traverse the full width of the shared source/drain region. Optionally, multiple polycrystalline portions 162 can be in each of the shared source/drain regions 142/132 and 132/152. Optionally, within each shared source/drain region 142/132 and 132/152, the multiple polycrystalline portions 162 can be physically separated (i.e., spaced apart). Optionally, when polycrystalline portions 162 are in both of the shared source/drain regions, they can be staggered such that no two polycrystalline portions 162 on opposite sides of the first gate structure 131 are aligned.

For example, in the semiconductor structure 100.4 of FIG. 4 and, more specifically, in the bulk semiconductor structure 100.4A of FIGS. 4A-1 to 4A-2 and also in the semiconductor-on-insulator structure 100.4B of FIGS. 4B-1 to 4B-2, the semiconductor layer 101 can have, within the active device area 111, one or more polycrystalline portions 162 including one or more polycrystalline portions 162 that extend vertically through the monocrystalline portion 161 in the shared source/drain region 142/132 and/or one or more polycrystalline portions 162 that extend vertically through the monocrystalline portion 161 in the shared source/drain region 132/152. Each polycrystalline portion 162 can have a length, which is measured in a direction perpendicular to the gate structures and which is approximately equal to the distance between the adjacent channel regions. Each polycrystalline portion 162 can further have a width, which is measured in a direction parallel to the gates and which is less than the width of the shared source/drain region such that the polycrystalline portion 162 does not traverse the full width of the shared source/drain region. Optionally, multiple polycrystalline portions 162 can be in each of the shared source/drain regions 142/132 and 132/152. Optionally, within each shared source/drain region 142/132 and 132/152, the multiple polycrystalline portions 162 can be physically separated (i.e., spaced apart). Optionally, when polycrystalline portions 162 are in both of the shared source/drain regions, they can be aligned. That is, pairs of adjacent polycrystalline portions 162 on opposite sides of the first gate structure 131 can be aligned.

Figure 5:
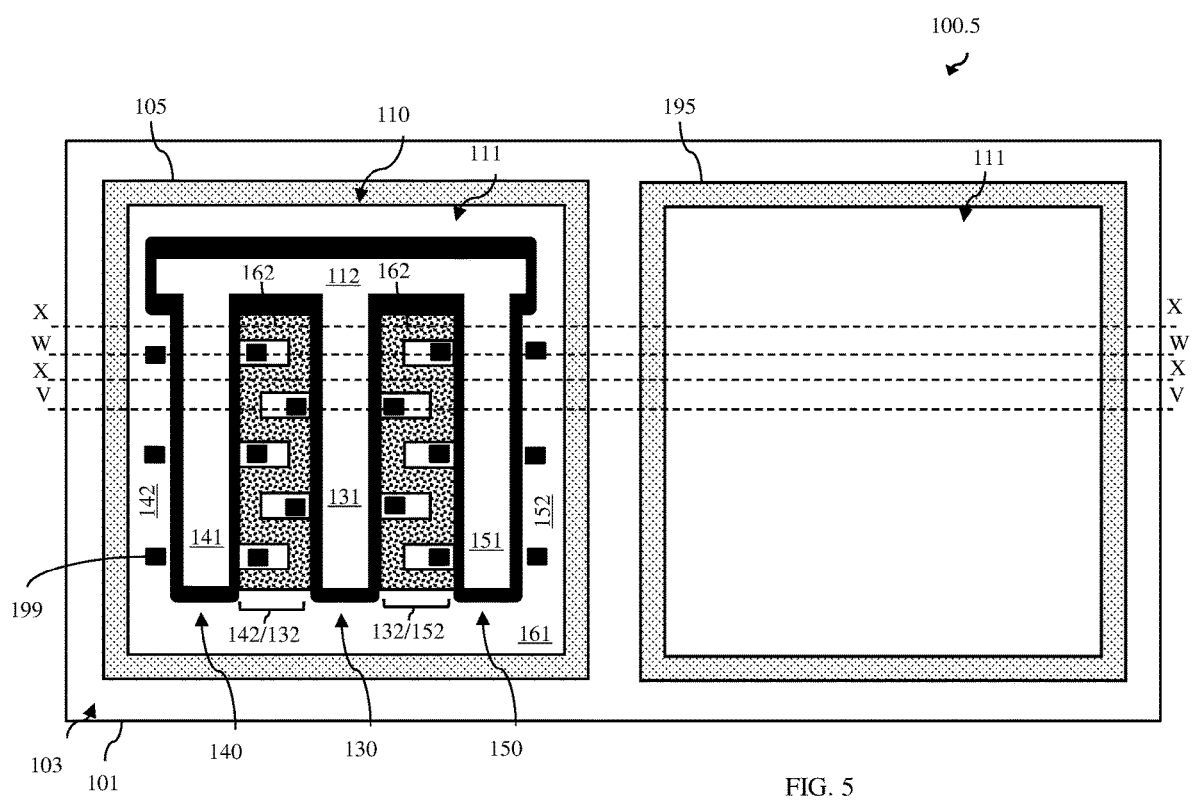
FIG. 5 is top-view diagram of a semiconductor structure with one or more in-device high resistivity polycrystalline semiconductor elements.
Figures 1, 5A:
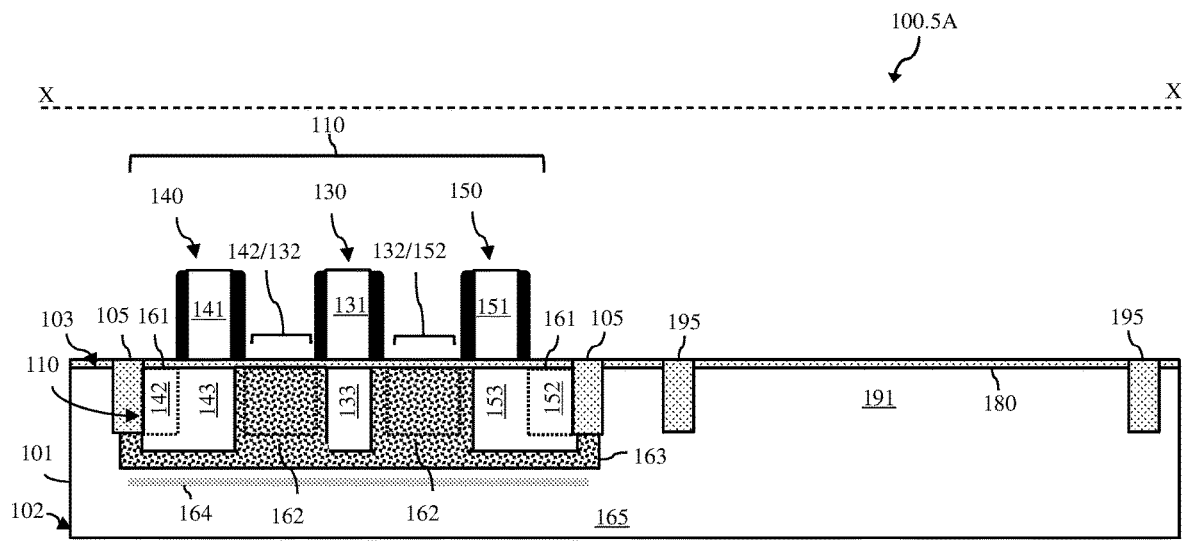
Figures 2, 5A:
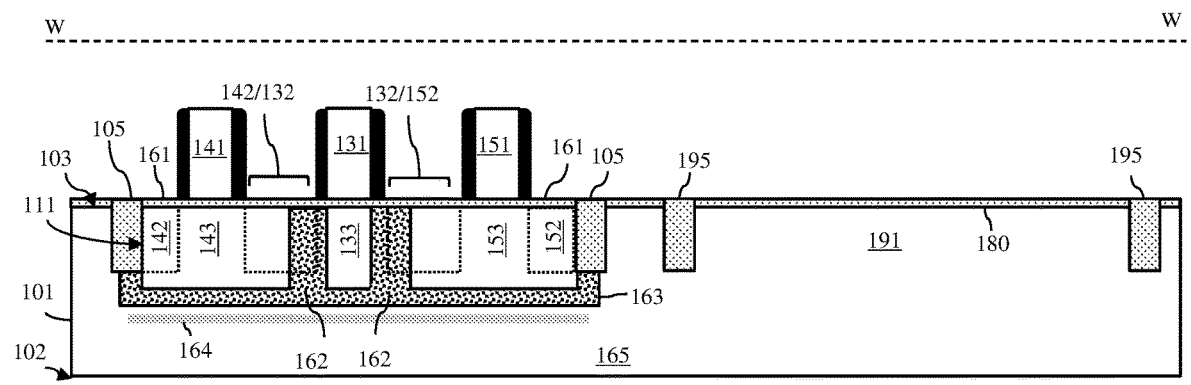
Figures 3, 5A:
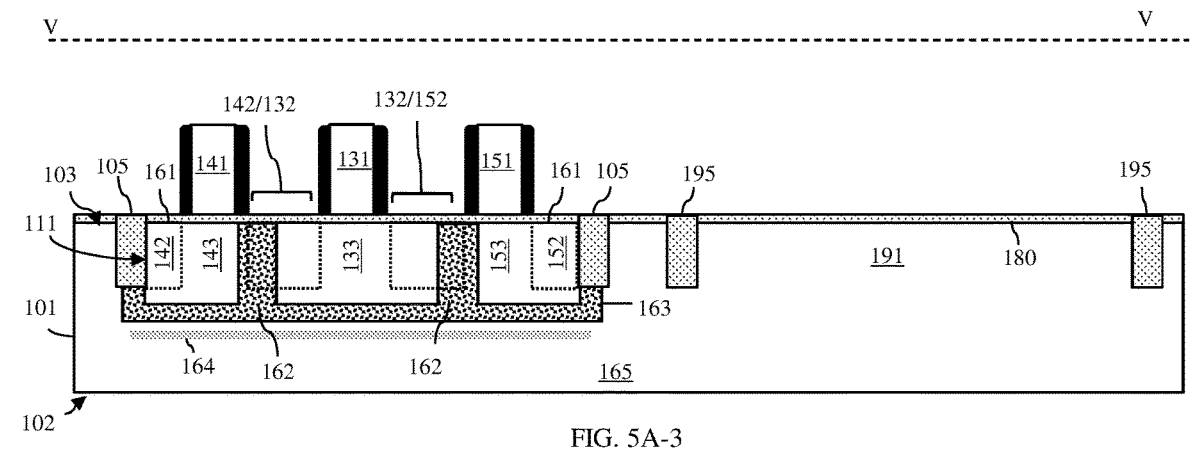
Figures 1, 5B:
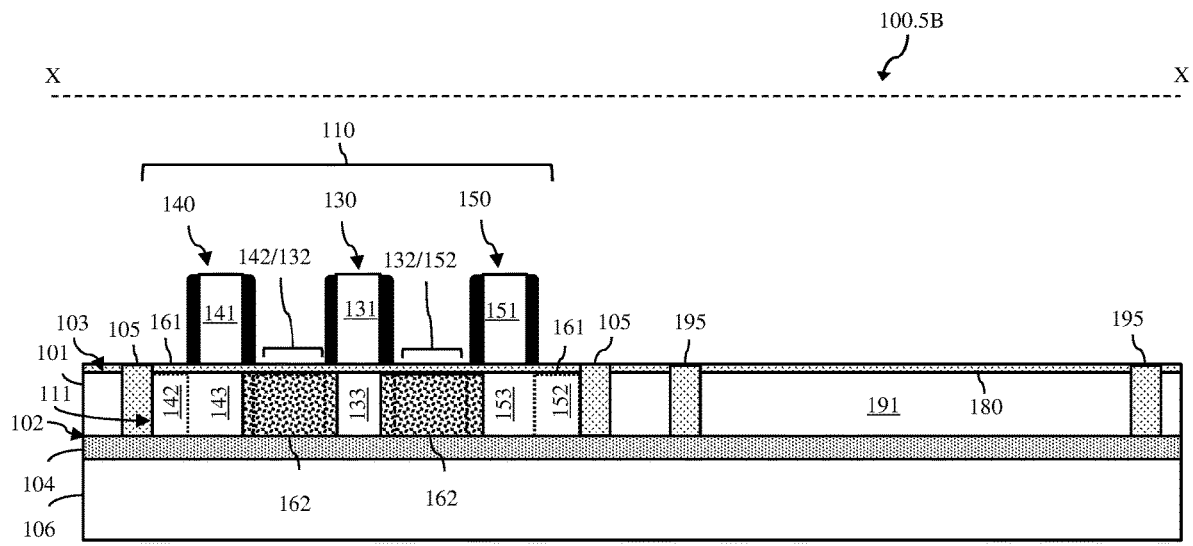
Figures 2, 5B:
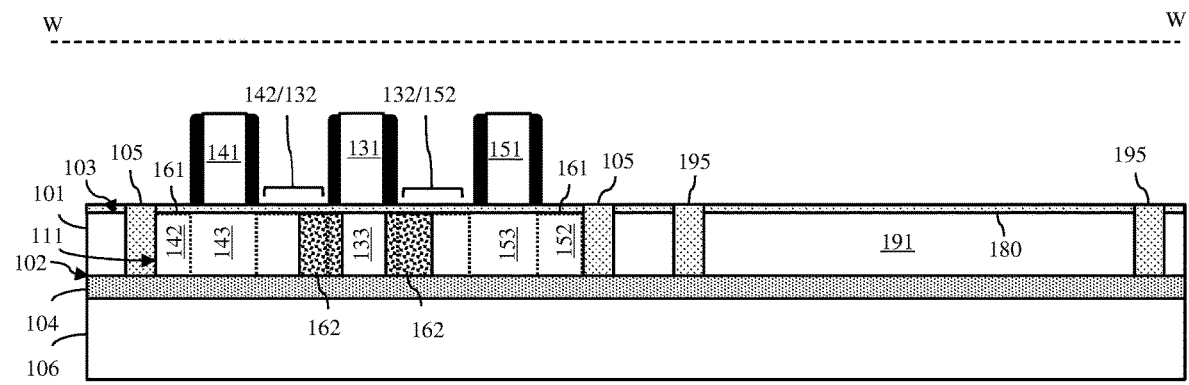
Figures 3, 5B:
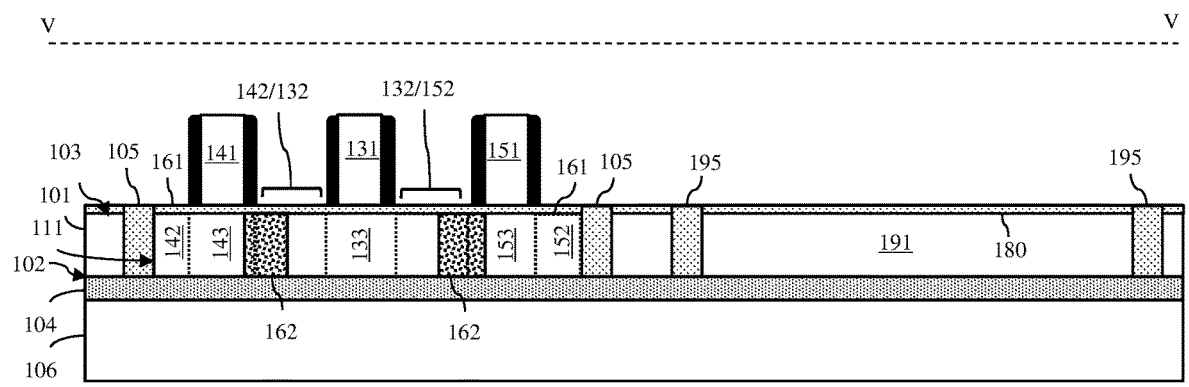

For example, in the semiconductor structure 100.5 of FIG. 5 and, more specifically, in the bulk semiconductor structure 100.45A of FIGS. 5A-1 to 4A-3 and also in the semiconductor-on-insulator structure 100.5B of FIGS. 5B-1 to 5B-3, the semiconductor layer 101 can have, within the active device area 111, one or more polycrystalline portions 162 including a polycrystalline portion 162 that extends vertically through the monocrystalline portion 161 in the shared source/drain region 142/132 and/or a polycrystalline portion 162 that extend vertically through the monocrystalline portion 161 in the shared source/drain region 132/152. Each polycrystalline portion 162 can include multiple perpendicular sections connected in a square zig-zag pattern across the full width of the shared source/drain region. Specifically, each polycrystalline portion 162 can have first sections, which oriented in a first direction perpendicular to the gate structures and which are evenly spaced across the width of the shared source/drain region, and second sections, which are oriented in a second direction parallel to the gate structure, which are evenly spaced across the width of the shared source/drain regions but staggered so that alternating second sections are on alternating sides of the shared source/drain region (e.g., close to one channel or the other) and which extend between and are in contact with adjacent first sections. Optionally, polycrystalline portions 162 with such a pattern in both of the shared source/drain regions 142/132 and 132/152 on opposite sides of the first gate structure 131 can be symmetrical (e.g., mirrored patterns).

It should be noted that, in all of the embodiments where the polycrystalline portion(s) 162 (i.e., the in-device high-resistivity polycrystalline semiconductor element(s)) extend vertically through a doped device component (e.g., a source/drain region of a FET), the polycrystalline portion(s) 162 can have the same doping (i.e., conductivity type and conductivity level) as the doped device component within which it is embedded. In a bulk semiconductor structure 100.1A-100.5A, the buried polycrystalline portion 163, which is in the middle portion of the substrate aligned between the active device area 111 and the lower portion of the substrate, may or may not be doped depending upon how deep within the semiconductor layer it lies (e.g., depending upon whether or not it lies within or beneath the well implant in the bodies of the FETs, depending upon whether or not there is a buried well below the bodies of the FETs, etc.).

Additionally, it should be noted that each shape that is designated in the drawings as a polycrystalline portion 162 (e.g., in each bulk semiconductor structure 100.1A-100.5A and in each semiconductor-on-insulator structure 100.1B-100.5B) and each shape designated in the drawings as a buried polycrystalline portion 163 (e.g., in each bulk semiconductor structure 100.1A-100.5A) can be entirely polycrystalline in structure. Alternatively, each shape that is designated in the drawings as a polycrystalline portion 162 and each shape designated in the drawings as a buried polycrystalline portion 163 can be a multi-layered structure, which includes a stack of relatively thick polycrystalline layers with relatively thin monocrystalline layers sandwiched between the polycrystalline layers. Variations in the crystalline structure of the polycrystalline portions 162 or 163 are dependent upon the formation technique used (see detailed discussion below regarding the method). It should also be noted that, due to the formation technique used, the bulk semiconductor structures 100.1A-100.5A may (or may not) also include processing artifact and, particularly, yet another high-resistivity polycrystalline portion 164 within the middle portion of the substrate aligned below the buried polycrystalline portion 163. This polycrystalline portion 164 can be relatively thin and may vary in shape.

Optionally, the semiconductor structure 100.1-100.5 can further include one or more additional trench isolation regions 195 in the semiconductor layer 101. The additional trench isolation regions 195 can, for example, also be STI regions and can define the boundaries of one or more additional areas 191 within the semiconductor layer 101. Although only one additional area 191 is shown, it should be understood that the semiconductor structure 100.1-100.5 could have multiple additional areas 191, each bounded by STI regions 195, and these additional area(s) could have the same or different design functions. For example, the additional area(s) 191 could include a passive device area, a dummy fill shape area, an additional active device area, etc. In order to avoid clutter in the figures and to allow the reader to focus on the salient aspects of the disclosed semiconductor structure embodiments with in-device polycrystalline semiconductor elements 162, the figures do not include any shapes illustrating specific features in and/or on the additional area(s) 191. Such shapes would vary depending upon the design function of the additional area 191 and/or depending upon whether the semiconductor structure is a bulk semiconductor structure or a semiconductor-on-insulator structure.

Additional features of the semiconductor structure 100.1-100.5 can include, but are not limited to: silicide layers on the top surfaces of the gate structures and/or the source/drain regions; one or more dielectric layers (e.g., a conformal etch stop layer, a blanket interlayer dielectric layer on the conformal etch stop layer, etc.) over devices on the semiconductor layer; and middle of the line (MOL) contacts that extend through the dielectric layer(s) to the devices (e.g., gate contacts (not shown) and source/drain contacts 199 (shown only in the top view diagrams) for the FETs). Such features are well known in the art and, thus, they are not illustrated in the drawings and the details thereof have been omitted from this specification in order to allow the reader to focus on the salient aspects of the disclosed embodiments. It should be noted that, in some embodiments, it may be preferrable for the polycrystalline portion(s) 162 and the source/drain contacts 199 to be patterned and formed so that the contacts are aligned above monocrystalline semiconductor material within each source/drain region and not above polycrystalline semiconductor material of any polycrystalline portion 162, as illustrated in the top view diagrams of the semiconductor structures 100.2-100.5 of FIGS. 2-5.

Also disclosed herein are method embodiments for forming the above-described semiconductor structures that include one or more in-device high resistivity polycrystalline semiconductor elements (e.g., see the exemplary semiconductor structures 100.1-100.5 of FIGS. 1-5).

Generally, each of the method embodiments includes providing a semiconductor layer 101, which has a bottom surface 102 (referred to herein as a first surface) and a top surface 103 (referred to herein as a second surface) opposite the bottom surface and which initially has a monocrystalline structure. The semiconductor layer 101 can be a bulk semiconductor substrate (e.g., a bulk silicon substrate) and can be employed for forming a bulk semiconductor structure (e.g., see the bulk semiconductor structures 100.1A of FIG. 1A, 100.2A of FIG. 2A, 100.3A of FIGS. 3A-1 to 3A-3, 100.4A of FIGS. 4A-1 to 4A-2, and 100.5A of FIGS. 5A-1 to 5A-3). Alternatively, the semiconductor layer 101 can be a semiconductor layer (e.g., a silicon layer) of a semiconductor-on-insulator wafer (e.g., a silicon-on-insulator (SOI) wafer) and can be employed for forming a semiconductor-on-insulator structure (e.g., see the semiconductor-on-insulator structures 100.1B of FIG. 1B, 100.2B of FIG. 2B, 100.3B of FIGS. 3B-1 to 3B-3, 100.4B of FIGS. 4B-1 to 4B-2, and 100.5B of FIGS. 5B-1 to 5B-3).

In any case, each of the method embodiments further includes processing the semiconductor layer 101 (e.g., using a patterned amorphization process followed by a recrystallization anneal process, as discussed in greater detail below) so that, within an active device area 111, the semiconductor layer 101 has a monocrystalline portion 161 at the top surface 103 and at least one polycrystalline portion 162, which extends vertically through the monocrystalline portion 161 from the top surface 103 toward (or to) the bottom surface 102. Each of the method embodiments further includes forming an active semiconductor device 110 such that the active semiconductor device 110 includes at least one device component, which is within the device area 111 and which includes at least one polycrystalline portion 162 (i.e., at least one in-device high-resistivity polycrystalline semiconductor element).

It should be noted that the active semiconductor device formed according to the disclosed method can be any type of active semiconductor device that might benefit from the incorporation of one or more in-device high resistivity polycrystalline semiconductor element within one or more of its components. For example, the active semiconductor device can be a field effect transistor (FET) with at least one source/drain region, which is in the device area of the semiconductor layer and which includes at least one polycrystalline portion that extends through the monocrystalline portion of the device area. This FET could be any type of FET ranging from a simple FET to a more complex FET, such as the multi-finger FET of a low noise amplifier (LNA) or a radio frequency (RF) switch. Polycrystalline portion(s) in a source/drain region of a FET can be employed, for example, to reduce the body effect time constant (e.g., in the case of an LNA) or to reduce harmonics (e.g., in the case of an RF switch). For purposes of illustration, the method embodiments are described in greater detail below and illustrated in the drawings with respect to the formation of a multi-finger FET. However, it should be understood that, alternatively, the method could include the formation of any other type of active semiconductor device with at least one device component, which is in the device area of the semiconductor layer and which includes at least one polycrystalline portion that extends through the monocrystalline portion of the device portion.

Figure 6:
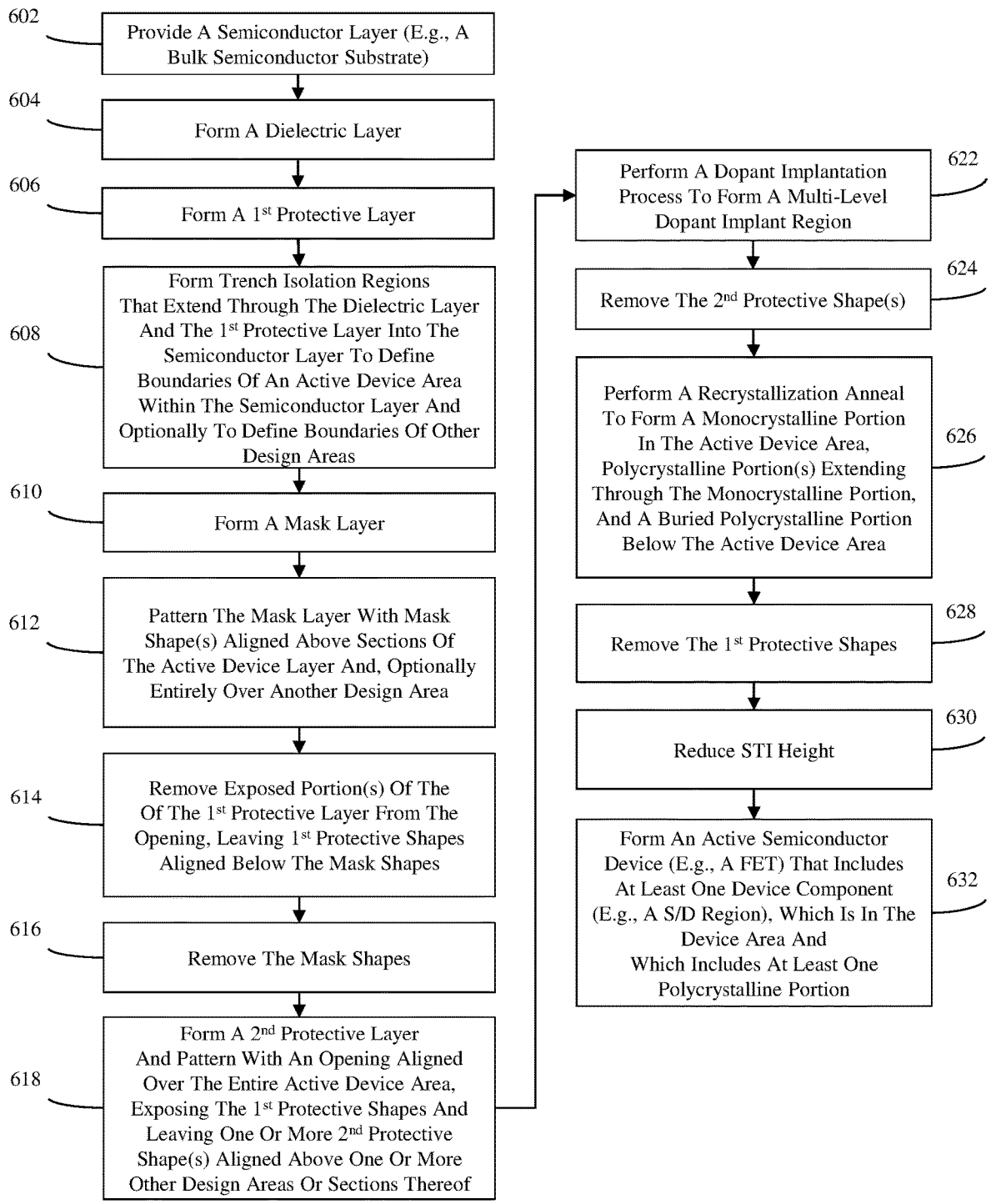
FIG. 6 is a flow diagram illustrating method embodiments for forming a bulk semiconductor structure with one or more in-device high resistivity polycrystalline semiconductor elements.

FIG. 6 is a flow diagram illustrating method embodiments specifically directed to the formation of the bulk semiconductor structures 100.1A of FIG. 1A, 100.2A of FIG. 2A, 100.3A of FIGS. 3A-1 to 3A-3, 100.4A of FIGS. 4A-1 to 4A-2, and 100.5A of FIGS. 5A-1 to 5A-3, each including an active semiconductor device 110 and, particularly, a multi-finger FET with in-device high-resistivity polycrystalline elements 162. These method embodiments can include providing a semiconductor layer 101 and, in this case, a bulk semiconductor substrate (e.g., a bulk monocrystalline silicon substrate) (see process step 602 and FIG. 7).

Figure 7:
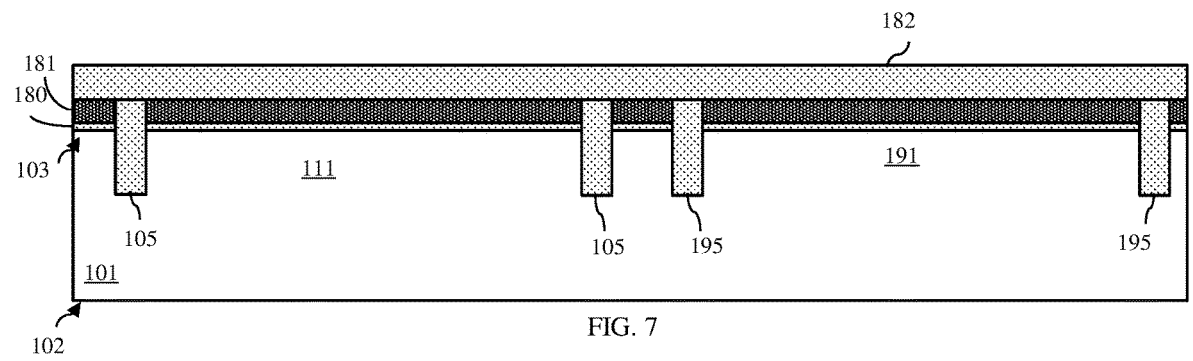
FIGS. 7-14 are cross-section diagrams illustrating partially completed structures formed according the flow diagram of FIG. 6.

A thin dielectric layer 180 of a first dielectric material can be formed on the top surface 103 of the semiconductor layer 101 (see process step 604 and FIG. 7). The first dielectric material can be, for example, a silicon dioxide (SiO₂) layer deposited onto the top surface 103 (e.g., by thermal oxidation).

A first protective layer 181 (also referred to herein as a dopant implant limiting layer) of a second dielectric material can be formed on the thin dielectric layer 180 (see process step 606 and FIG. 7). The second dielectric material can be different from the first dielectric material. For example, the second dielectric material can be silicon nitride (SiN) deposited onto the top surface of the dielectric layer 180 by, for example, chemical vapor deposition (CVD) or plasma-enhanced CVD (PECVD). It should be noted that process steps 622-626 (discussed in greater detail below) include a dopant implantation process and a rapid thermal anneal (RTA) process. Prior to the dopant implantation process, protective shapes with different thickness are formed on the semiconductor layer (i.e., with different total heights as measured form the top surface of the semiconductor layer). As a result, the inert dopant is prevented from being implanted into the semiconductor layer in some areas and a multi-level dopant implant region with a modified crystalline structure and, particularly, an amorphous crystalline structure is created in other areas. During the RTA, recrystallization of the multi-level dopant implant region occurs creating polycrystalline portion(s) 162, buried polycrystalline portion(s) 163, and monocrystalline portion(s) 161 (as discussed in greater detail below). The first protective layer 181 will subsequently be used in the formation of first protective shapes and, thus, should be deposited so as to have a thickness sufficient to limit implantation of inert dopant into the semiconductor layer 101 at process step 622 to some predetermine depth. For example, the first protective layer 181 can have a thickness ranging from 30-250 nm.

Trench isolation regions, such as shallow trench isolation (STI) regions, can then be formed so that they extend through the first protective layer 181 and the dielectric layer 180 and into the top surface 103 of the semiconductor layer 101 and further so that they define the boundaries of an active device area 111 within the semiconductor layer 101 (see process step 608 and FIG. 7). Optionally, additional trench isolation region(s) 195 can concurrently be formed at process step 608 to define the boundaries of additional design area(s) 191 (e.g., a passive device area, a dummy fill shape area, an additional active device area, etc.) within the same semiconductor layer 101. The above-mentioned STI regions (e.g., STI 105 and, if applicable STI 195) can be formed, at process step 608, using conventional STI formation techniques. Specifically, trenches can be lithographically patterned and etched such that they extend essentially vertically through the first protective layer 181 and the dielectric layer 180 and into the top surface 103 of the semiconductor layer 101 with a bottom of each trench being some predetermined distance below the top surface 103. One or more layers of isolation material can be deposited so as to fill the trenches. In one exemplary embodiment, the isolation material can be the first dielectric material (e.g., SiO₂). Following deposition of the isolation material, a chemical mechanical polishing (CMP) process can be performed in order to remove the isolation material from above the top surface of the first protective layer 181 such that the top surfaces of the STI regions and the top surface of the first protective layer 181 are essentially co-planar.

Figure 8:
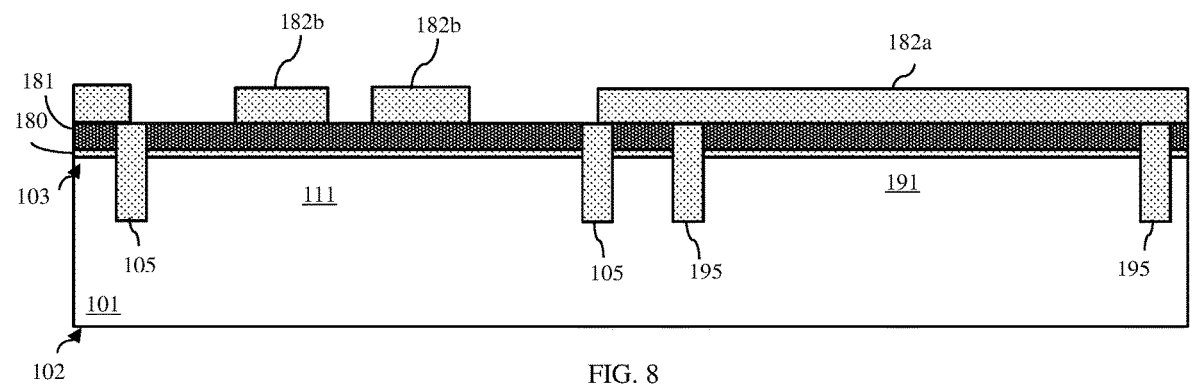

A mask layer 182 can then be formed on the first protective layer 181 and over the STI regions (see process step 610 and FIG. 7). The mask layer 182 can be made, for example, of the same first dielectric material (e.g., SiO₂) used for the dielectric layer 180 and can be deposited, for example, by PECVD. Alternatively, the mask layer 182 can be made of any suitable dielectric material that is different from the second dielectric material used for the first protective layer 181. The mask layer 182 can further be patterned (e.g., using conventional lithographic patterning and etch techniques) so as to at least one mask shape 182b over a section of the active device area 111 and, optionally, so as to have one or more additional mask shapes 182a (e.g., entirely covering the design area 191) (see process step 612 and FIG. 8). The mask shape(s) 182b can be patterned so that they correspond to the desired two-dimensional size, shape, location, orientation, etc. of the polycrystalline portion(s) to be formed with the active device area 111 (e.g., within designated shared source/drain region(s) for adjacent FETs). For purposes of illustration, the mask shape(s) 182b are shown in the drawings so that they correspond to the size, shape, location, orientation, etc. of the polycrystalline portion(s) 162, which fully encompass both of the shared source/drain regions of a multi-finger FET as shown in the bulk semiconductor structure 100.1A of FIG. 1A. However, it should be understood that the drawings are not intended to be limiting and that, alternatively, the mask shapes 182b could correspond to the size, shape, location, orientation, etc. of the polycrystalline portion(s) 162 shown in any of the other bulk semiconductor structures described above.

Figure 9:
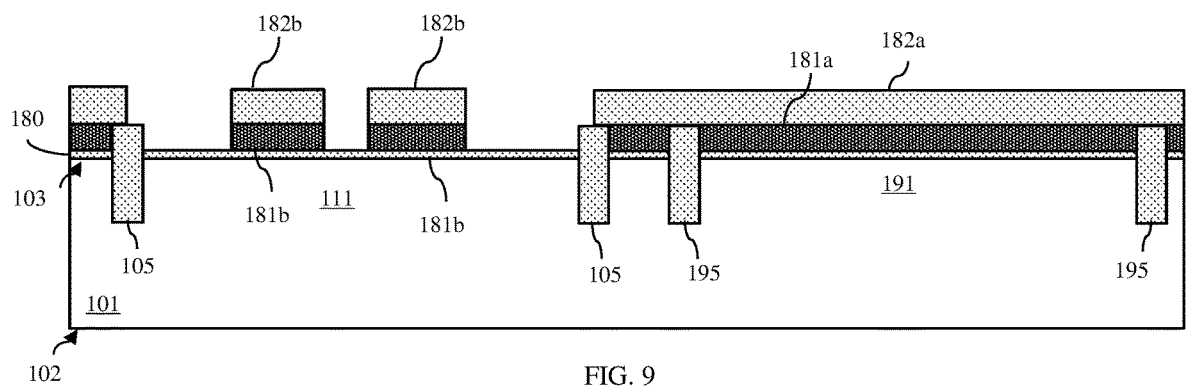
Figure 10:
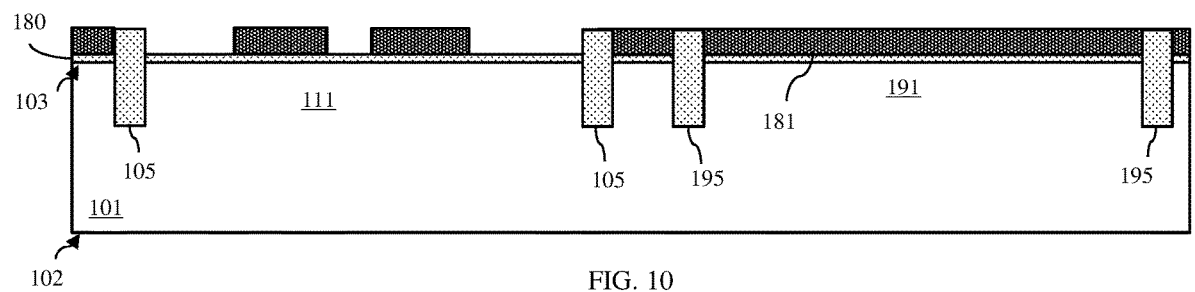

Exposed portions of the first protective layer 181 (e.g., adjacent to/surrounding the mask shape(s) 182b) can be selectively removed (e.g., using a selective anisotropic etch process) (see process step 614 and FIG. 9). If the dielectric layer 180, the STI regions 105, and the mask layer 182 are all made of the same first dielectric material (e.g., SiO₂) and if the first protective layer 181 is made of the second dielectric material (e.g., SiN), then any suitable process that selectively etches exposed SiN over exposed SiO₂ could be employed at process step 614. For example, a hot phosphoric acid etch process could be used. As illustrated, process step 614 effectively transfers the pattern of the mask shapes 182a and 182b to form a pattern of first protective shapes 181a and 181b directly below. The mask layer 182 and, more particularly, the remaining mask shapes 182a and 182b can then be selectively removed (see process step 616 and FIG. 10). For example, if the mask layer 182 is made of the first dielectric material (e.g., SiO₂), it can be selectively removed by a selective oxide wet etch process (e.g., a hydrofluoric acid (HF) etch) or by a reactive ion etch (RIE) process. It should be noted that, if the dielectric layer 180 and the mask layer 182 are made of the same first dielectric material (e.g., SiO₂), then process step 614 may also expose and etch away portions of the dielectric layer 180 within the opening 185 adjacent to the first protective shapes 181b, thereby exposing the top surface 103 of the semiconductor layer 101 adjacent to the first protective shapes 181b. Thus, before additional processing is performed, the first dielectric material of the dielectric layer 180 should be redeposited (e.g., regrown) on the exposed semiconductor surface within the first section.

Figure 11:
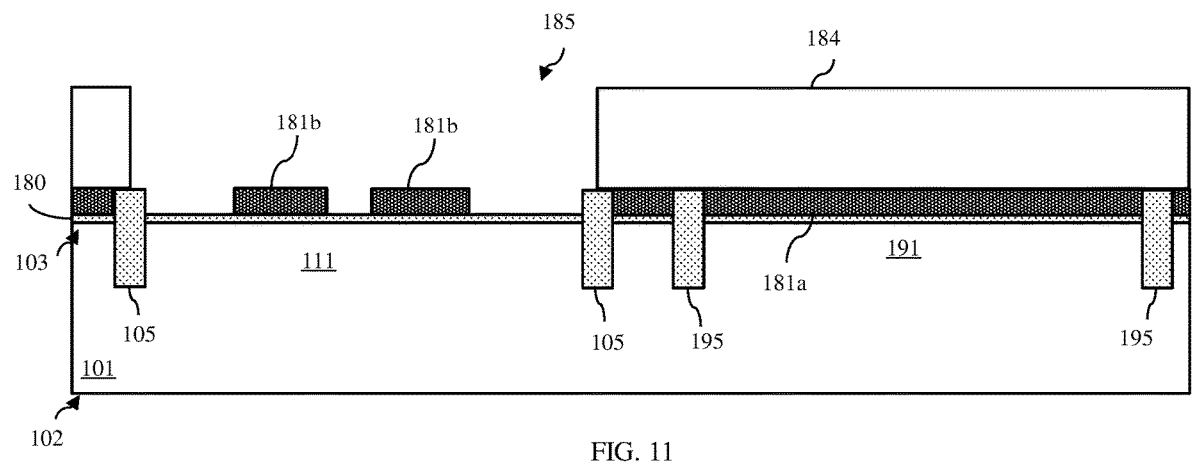

A second protective layer 184 (also referred to herein as a dopant implant stopping layer) can be formed over the partially completed structure. This second protective layer can be, for example, a photoresist mask layer, a nitride mask layer or a layer of any other suitable mask material. This second protective layer 184 can then be lithographically patterned and etched to expose the first protective shapes 181*b* above the active device area 111 and also portions of dielectric layer 180 on the active device area and not covered by the first protective shapes 181*b* (see process steps 618 and FIG. 11). Remaining portion(s) of the second protective layer 184 can overlay the first protective shape(s) 181*a* and the stacked protective layers can create second protective shape(s), which are thicker (i.e., taller) than the first protective shape(s) 181*b* and which are positioned above any area of the semiconductor layer where implantation of the inert dopant at process step 622 for purposes of creating a modified crystalline structure is undesirable. To prevent implantation of the inert dopant, the second protective layer should be deposited so that it is thick enough (given whatever material it is made of in combination with the first protective shape 181*a* and the dielectric layer 180 below) to ensure that the inert dopant doesn't pass into the semiconductor layer. For example, if the second protective layer is a photoresist layer, it should be at least 2 nm and preferably 4 nm or greater.

Figure 12:
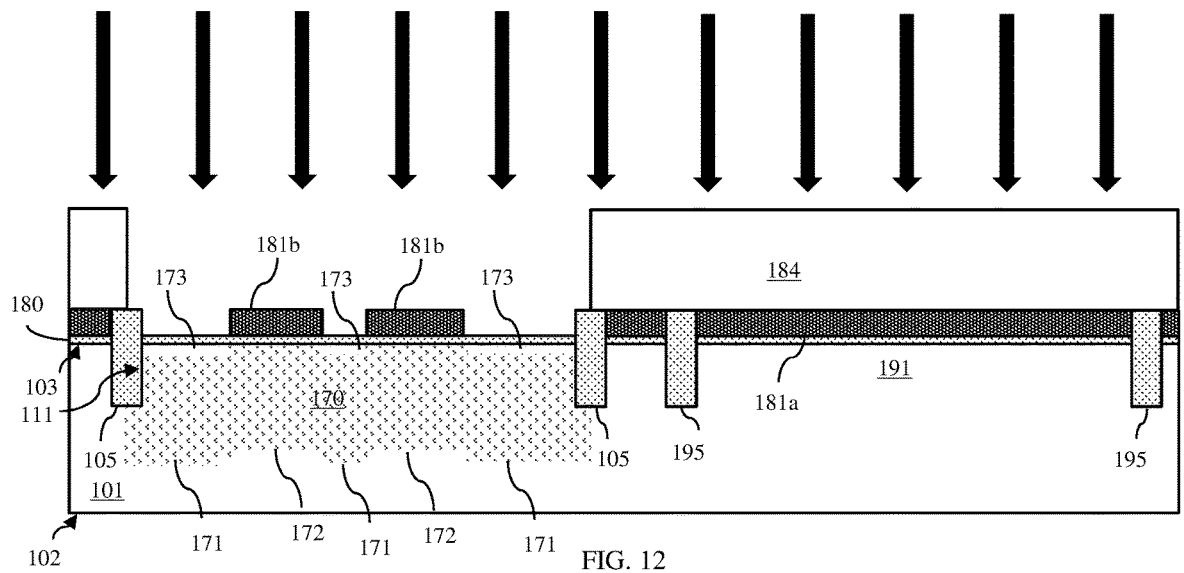

Next, the dopant implantation process can be performed in order to implant the inert dopant into the semiconductor layer 101 at desired locations and, thereby form the multi-layer dopant implant region 170 with the modified crystalline structure (e.g., with the amorphous crystalline structure) (see process step 622 and FIG. 12). The resulting multi-level dopant implant region 170 will have first areas 171, which extend a first depth into the semiconductor layer and which are aligned below dielectric material of the dielectric layer 180 only, and second areas 172, which extend to a second depth that is shallower than the first depth and which are aligned below the first protective shape(s) 181*b*. It should be noted that, when the inert dopant only passes through the dielectric layer 180, the crystalline structure adjacent to the top surface 103 of the semiconductor layer 101 is not modified and, as a result, the first areas 171 are separated from the top surface 103 of the semiconductor layer 101 by some short distance (e.g., less than 5 nm). In order words, a relatively thin (e.g., less than 5 nm) monocrystalline layer 173 will remain between the top surface 103 of the semiconductor layer 101 and the first areas 171. However, when the inert dopant has to pass through both a first protective shape 181*b* and the dielectric layer 180, the crystalline structure at the top surface of the semiconductor layer is modified and, as a result, the second areas 172 are immediately adjacent to the top surface 103.

For purposes of this disclosure, an inert dopant refers to a dopant species that is generally not considered to be chemically reactive (i.e., that is neutral) at least with respect to the monocrystalline semiconductor material (e.g., monocrystalline silicon) within which it is implanted at process step 622, that is capable of modifying the crystalline structure of that monocrystalline semiconductor material at process step 622, that won't prevent recrystallization of the multi-level dopant implant region 170 during the RTA process at process step 626, as discussed in greater detail below, and that doesn't significantly impact the electrical properties of the resulting poly and/or monocrystalline semiconductor regions following recrystallization. Such inert dopants include, but are not limited to, inert gases (also referred to as noble gases) (e.g., argon, xenon, helium, neon, krypton, radon, etc.), silicon, or any other suitable inert dopant. Process step 622 can include a single dopant implantation process employed to create the multi-level dopant implant region 170. Alternatively, process step 622 can include multiple successive dopant implantation processes and each dopant implantation process can implant dopant ions at different kinetic energies and/or different doses to optimize the modified crystalline structure and potentially achieve greater implant depths for both the first areas 171 and the second areas 172.

As discussed above, any second protective shape(s) above the semiconductor layer 101 will prevent implantation of the inert dopant and ensure that the area of the semiconductor layer below (e.g., see the design area 191) will retain its' original monocrystalline structure throughout process steps 622-626.

Following process step 622, the second protective layer can be selectively removed (see process step 624). As mentioned above, the second protective layer could be, for example, a photoresist mask layer or a nitride mask layer. Techniques for selectively removing such materials are well known in the art.

Figure 13:
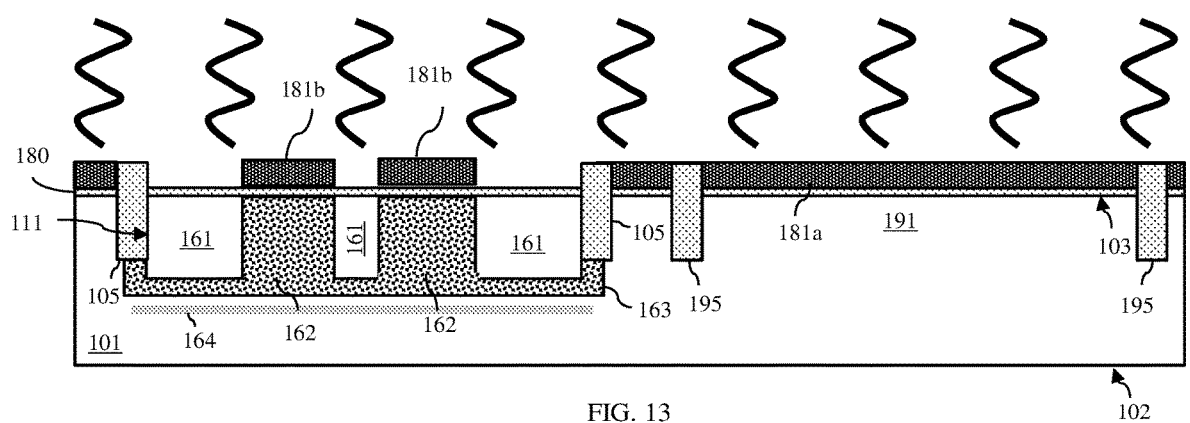

The RTA process can then be performed in order to recrystallize the multi-level dopant implant region 170 (see process step 626 and FIG. 13). That is, the partially completed structure can be heated at a relatively high temperature (e.g., over 900° C.) for a relatively short period of time (e.g., 5-180 seconds) in a non-oxidizing ambient environment. During this recrystallization process, a lower portion of the semiconductor layer 101, which is below the dopant implant region 170 and which has the original monocrystalline structure, and also the thin monocrystalline layer 173, which is between the top surface 103 of the semiconductor layer 101 and the first areas 171, act as seed layers for recrystallization. Thus, within the first areas 171, recrystallization occurs from the top adjacent to the monocrystalline layer 173 downward and also from the bottom adjacent to the lower portion of the semiconductor layer upwards, whereas, within the second areas 172, recrystallization occurs from the bottom upwards but not from the top downwards.

As a result, following the process step 626, the semiconductor layer 101 will have, within the active device area 111, a monocrystalline portion 161 that extends laterally from one trench isolation region 105 to another and one or more polycrystalline portion(s) 162 that extend vertically through the monocrystalline portion 161 and that are aligned below the first protective shapes 181*b*. The semiconductor layer 101 will also have a buried polycrystalline portion 163 (also referred to herein as buried high-resistivity polycrystalline semiconductor element) below the active device area 111. The monocrystalline portion 161 of the active device area 111 can extend downward from the top surface 103 to the top of the buried polycrystalline portion 163. The polycrystalline portion(s) 162 can extend downward from the top surface 103 and can merge with the buried polycrystalline portion 163. As mentioned above with regard to the structure embodiments, the bottom of the buried polycrystalline portion 163 is illustrated in the drawings as being essentially planar. However, it should be understood that the depth of the bottom of the buried polycrystalline portion 163 may be greater below the monocrystalline portion 161 than it is below the polycrystalline portion(s) 162.

For purposes of illustration, the method steps have been illustrated in the drawings with the first protective shapes 181*b* being patterned so that following process steps 622-626 the resulting polycrystalline portions 162 will be the same as those shown in the bulk semiconductor structure 100.1A of FIG. 1A. However, it should be understood that, by varying the pattern of the first protective shapes 181*b* (e.g., the numbers, size, shapes, orientations, locations, etc.

of the second protective shapes 181b) on the active device area, different patterns of polycrystalline portions 162 within the active device area 111 can be achieved in order to achieve different bulk semiconductor structures (e.g., the bulk semiconductor structures 100.2A, 100.3A, 100.4A, or 100.5A or any other similar bulk semiconductor structure, which includes an active device area 111 within monocrystalline and polycrystalline portions 161-162 and which has a buried polycrystalline portion 163 below).

It should be noted that the configuration of the polycrystalline portion(s) 162 and the buried polycrystalline portion 163 (e.g., as single or multi-layered) will vary depending upon the type of dopant implantation process used at process step 622. That is, as mentioned above, process step 622 can include either a single dopant implantation process or multiple successive dopant implantation processes. If a single dopant implantation process is used at process step 622, then process step 626 may result in a configuration where each shape designated in the drawings as a polycrystalline portion 162 or a buried polycrystalline portion 163 is entirely polycrystalline in structure. Alternatively, if multiple successive dopant implantation processes are used at process step 622, then process step 626 may result in a configuration where each shape designated in the drawings as a polycrystalline portion 162 or a buried polycrystalline portion 163 is a multi-layered structure, which includes a stack of relatively thick polycrystalline layers with relatively thin monocrystalline layers sandwiched between the polycrystalline layers.

It should also be noted that other characteristics of the monocrystalline and polycrystalline portions will depend upon the process specifications used at process steps 622-626. For example, the thickness of the monocrystalline portion 161 can be controlled primarily by the energy of the implant (e.g., higher energy can result in a thicker monocrystalline portion 161), and secondarily by the RTA time (e.g., less RTA time can result in a thinner monocrystalline portion 161). Those skilled in the art will recognize that thickness of the monocrystalline portion 161 (as measured from the top surface 103 of the semiconductor layer to the top of the buried polycrystalline portion 163 below) should be sufficient to allow at least one active semiconductor device 110 to be formed thereon (see process step 632 below) and to function properly.

Following process step 626, the semiconductor layer 101 will retain the monocrystalline structure (i.e., will have additional monocrystalline portions 165) below the buried polycrystalline portion 163 and through the semiconductor layer 101 (i.e., from the top surface 103 to the bottom surface 102) in areas that were protected by the second protective shapes during the dopant implantation process. However, in some cases, a processing artifact and, particularly, a relatively thin buried polycrystalline portion 164 may also appear in the semiconductor layer 101 aligned below the buried polycrystalline portion 163. This relatively thin buried polycrystalline portion may be essentially planar, as shown, or have some other shape.

Figure 14:
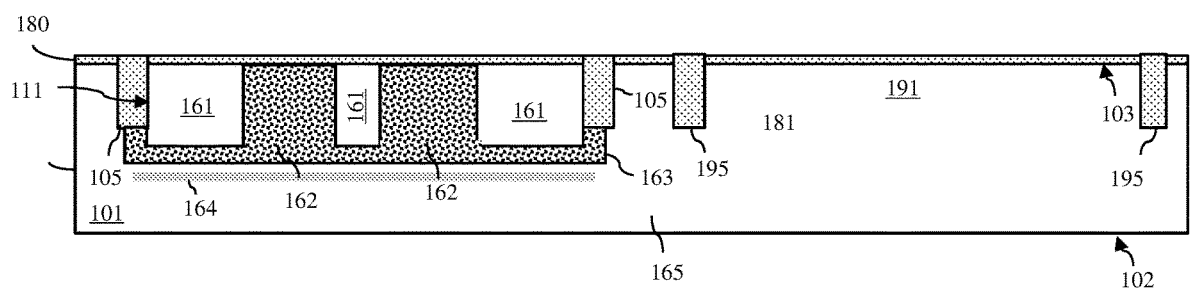

The first protective shapes 181a-181b can subsequently be selectively removed (see process step 628 and FIG. 14). For example, if the dielectric layer 180 and the STI regions were made of the same first dielectric material (e.g., SiO₂) and if the first protective layer 181 was made of the second dielectric material (e.g., SiN), then any suitable process that selectively etches exposed SiN over exposed SiO₂ could be employed. Thus, a hot phosphoric acid etch process could be used. Optionally, the height of the STI regions can also be reduced (e.g., using a deglazing or a wet etch process) so that the tops of the STI regions are approximately level with the top surface of the dielectric layer 180 (see process step 630 and FIG. 14). It should be noted that, if process step 630 results in removal of the dielectric layer 180 and exposure of the semiconductor surface below, the first dielectric material can be redeposited (e.g., by thermal oxidation) to reform this dielectric layer 180.

Figure 15:
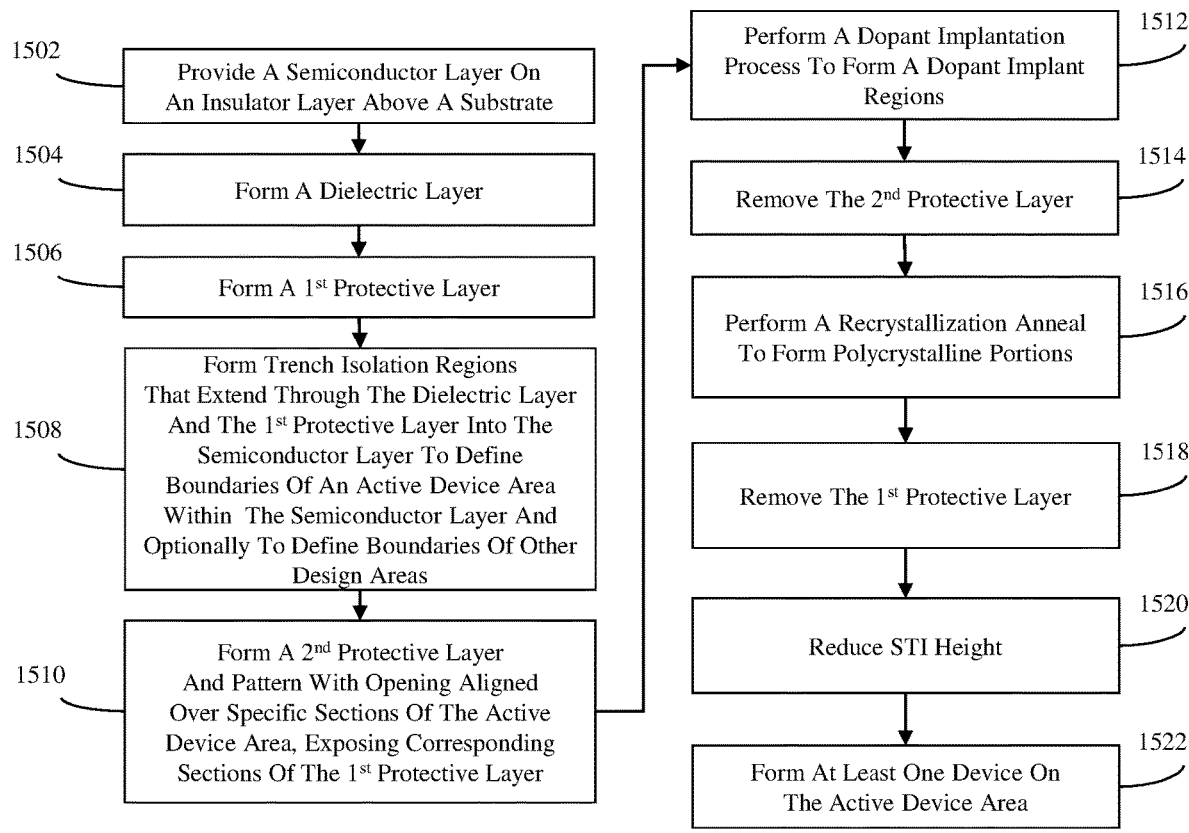
FIG. 15 is a flow diagram illustrating method embodiments for forming a semiconductor-on-insulator structure with one or more in-device high resistivity polycrystalline semiconductor elements.

FIG. 15 is a flow diagram illustrating method embodiments directed to the formation of the semiconductor-on-insulator structures 100.1B of FIG. 1B, 100.2B of FIG. 2B, 100.3B of FIGS. 3B-1 to 3B-3, 100.4B of FIGS. 4B-1 to 4B-2, and 100.5B of FIGS. 5B-1 to 5B-3, each having an active semiconductor device 110 and, particularly, a multi-finger FET with in-device high-resistivity polycrystalline elements 162. The process steps are similar to those described above with regard to formation of the bulk semiconductor structures but are somewhat less complex because the need to concurrently form a buried polycrystalline portion below the active device area 111 is eliminated due to the presence of an insulator layer below the semiconductor layer.

Specifically, these method embodiments can include providing a semiconductor layer 101 (e.g., a monocrystalline silicon layer), which has a bottom surface 102 (referred to herein as a first surface) and a top surface 103 (referred to herein as a second surface) opposite the bottom surface 102. The bottom surface 102 of the semiconductor layer 101 can be above and immediately adjacent to the top surface of an insulator layer 104 (e.g., a buried silicon dioxide layer, also referred to herein as a BOX layer), which is on a semiconductor substrate 106 (e.g., a silicon substrate) (see process step 1502 and FIG. 16).

Figure 16:
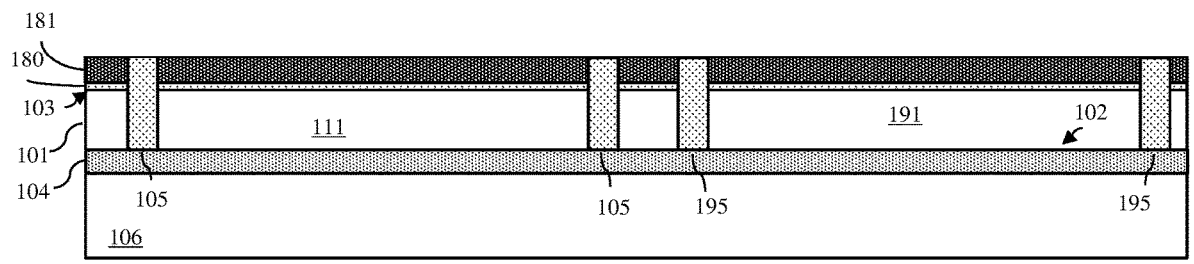
FIGS. 16-20 are cross-section diagrams illustrating partially completed structures formed according the flow diagram of FIG. 15.

A thin dielectric layer 180 of a first dielectric material can be formed on the top surface 103 of the semiconductor layer 101 (see process step 1504 and FIG. 16). The first dielectric material can be, for example, a silicon dioxide (SiO₂) layer deposited onto the top surface 103. Additionally, a first protective layer 181 (also referred to herein as a dopant implant limiting layer) of a second dielectric material can be formed on the thin dielectric layer 180 (see process step 1506 and FIG. 16). The second dielectric material can be different from the first dielectric material. For example, the second dielectric material can be silicon nitride (SiN).

Trench isolation regions, such as shallow trench isolation (STI) regions, can then be formed so that they extend through the first protective layer 181 and the dielectric layer 180 and into the top surface 103 of the semiconductor layer 101 and further so that they define the boundaries of an active device area 111 within the semiconductor layer 101 (see process step 1508 and FIG. 16). Optionally, additional trench isolation region(s) 195 can concurrently be formed at process step 1508 to define the boundaries of additional design area(s) 191 (e.g., a passive device area, a dummy fill shape area, an additional active device area, etc.) within the same semiconductor layer 101.

Figure 17:
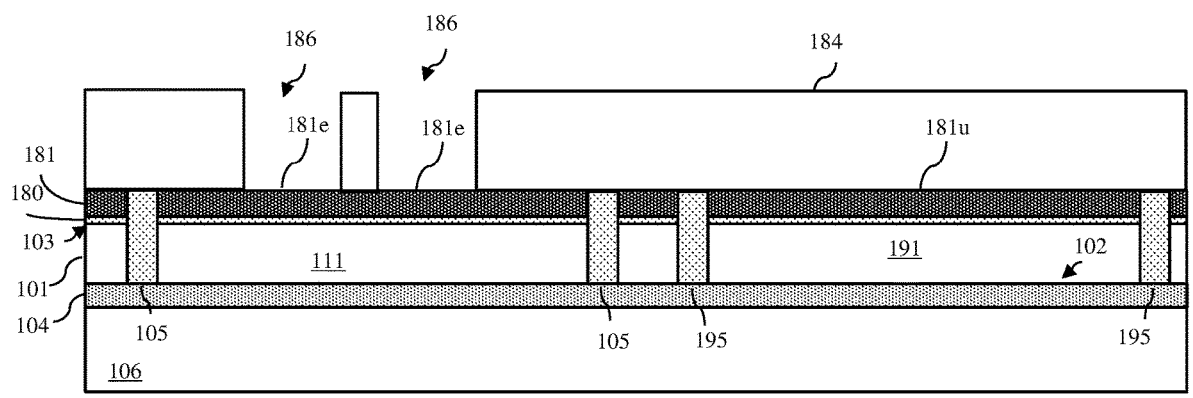

Next, a second protective layer 184 (also referred to herein as a dopant implant stopping layer) can be formed over the partially completed structure. This second protective layer can be, for example, a photoresist mask layer, a nitride mask layer or a layer of any other suitable mask material. This second protective layer can then be lithographically patterned and etched with one or more openings 186 that expose one or more specific sections of the first protective layer (i.e., that expose one or more first protective shape(s) 181e). The first protective shape(s) 181e can be above one or more corresponding sections of the active device area 111 within which polycrystalline elements are to be formed (see process steps 1510 and FIG. 17). Remaining portion(s) of the second protective layer can overlay other sections of the first protective layer, which are above the active device area 111 and, optionally, which are above one or more other design areas (e.g., above design area 191) or sections thereof. The stacked protective layers can create second protective shape(s), which are thicker (i.e., taller) than the first protective shape(s) 181e and which are formed above any area of the semiconductor layer within which no polycrystalline elements are to be formed.

Figure 18:
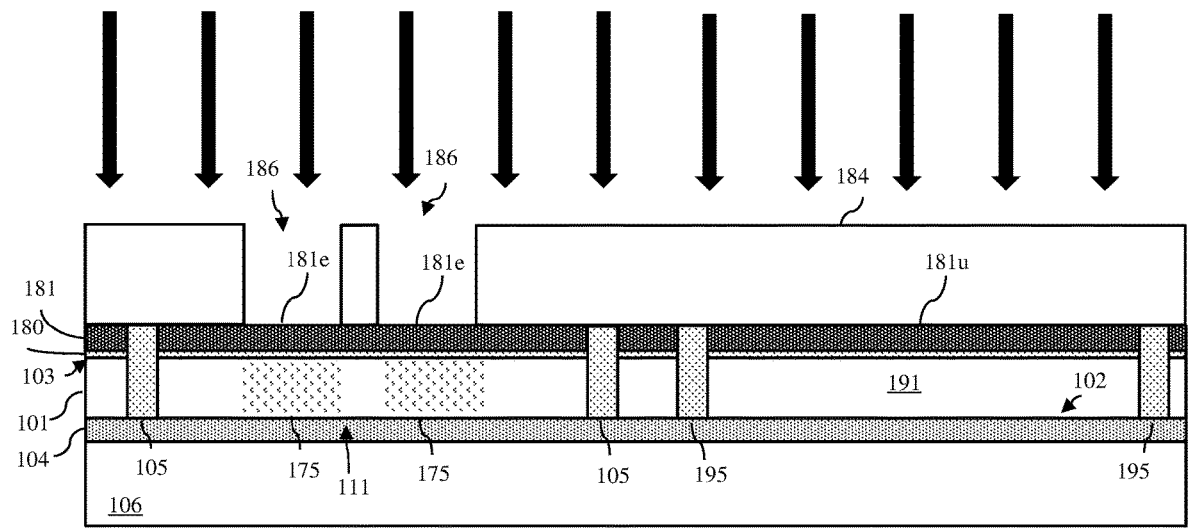

A dopant implantation process can subsequently be performed in order to implant an inert dopant into the semiconductor layer 101 at the desired location(s) (i.e., in section(s) of the semiconductor layer 101 within the active device area 111 and aligned below the opening(s) 186 within the second protective layer 184 and the first protective shape(s) 181e). Implantation of the inert dopant results in the formation of dopant implant region(s) 175 with a modified crystalline structure (e.g., with an amorphous crystalline structure) (see process step 1522 and FIG. 18). Since the inert dopant has to pass through both a first protective shape 181e and the dielectric layer 180, the crystalline structure immediately adjacent to the top surface 103 of the semiconductor layer 101 is modified and, as a result, the dopant implant region(s) 175 are immediately adjacent to the top surface 103. As discussed above, if the first protective shape(s) were not present during the dopant implantation process, a monocrystalline semiconductor layer would be present between the top surface of the semiconductor layer and the dopant implant region(s) 175. Additionally, as discussed above, the presence of the second protective layer 184 will prevent implantation of the inert dopant in other areas such that those areas will retain their original monocrystalline structure. Following process step 1512, the second protective layer 184 can be selectively removed (see process step 1514).

Figure 19:
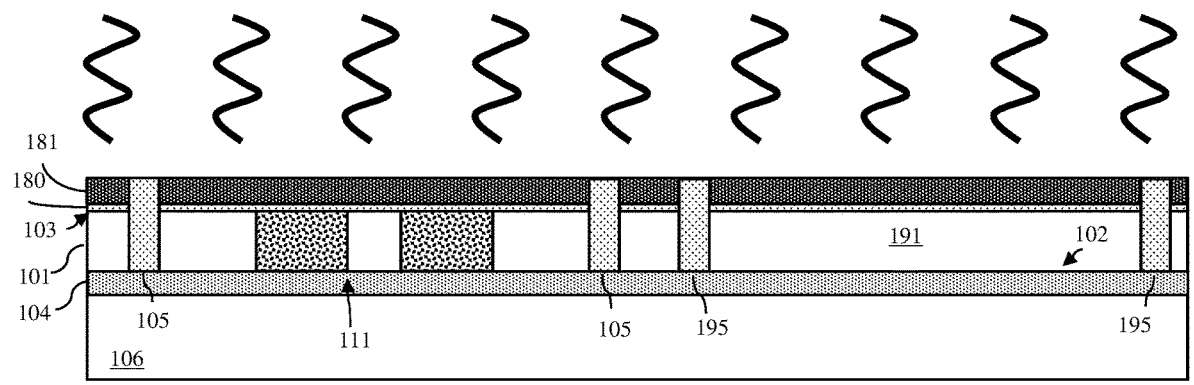

An RTA process can then be performed in order to recrystallize the dopant implant region(s) 175, thereby forming polycrystalline portion(s) 162 that extend vertically from the top surface 103 of the semiconductor layer 101 through a remaining monocrystalline portion 161 of the semiconductor layer 101 within the active device area 111 (see process step 1516 and FIG. 19).

For purposes of illustration, the method steps have been illustrated in the drawings with the first protective shapes 181e being patterned so that following process steps 1512-1516 the resulting polycrystalline portions 162 will be the same as those shown in the semiconductor-on-insulator structure 100.1B of FIG. 1B. However, it should be understood that, by varying the pattern of the first protective shape(s) 181e (e.g., the numbers, size, shapes, orientations, locations, etc. of the first protective shape(s) 181e) on the active device area, different patterns of polycrystalline portions 162 within the active device area 111 can be achieved in order to achieve different semiconductor-on-insulator structures (e.g., the semiconductor-on-insulator structures 100.2B, 100.3B, 100.4B, or 100.5B or any other similar semiconductor-on-insulator structure, which includes an active device area 111 within monocrystalline and polycrystalline portions 161-162 and an insulator layer below).

Figure 20:
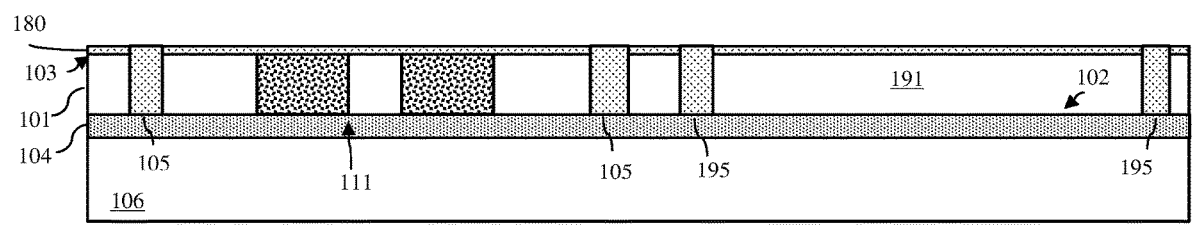

The first protective layer 181 can subsequently be selectively removed (see process step 1518 and FIG. 20). Optionally, the height of the STI regions can also be reduced so that the tops of the STI regions are approximately level with the top surface of the dielectric layer 180 (see process step 1520 and FIG. 20). It should be noted that, if process step 1520 results in removal of the dielectric layer 180 and exposure of the semiconductor surface below, the first dielectric material can be redeposited to reform this dielectric layer 180.

Referring to both the flow diagram of FIG. 6 and the flow diagram of FIG. 15, following formation of high resistivity polycrystalline semiconductor elements in the semiconductor layer 101, additional processing can be performed in order to complete the semiconductor structure 100.1-100.5 (see process step 632 of FIG. 6 and bulk semiconductor structures 100.1A-100.5A shown in FIG. 1A, FIG. 2A, FIGS. 3A-1 to 3A-3, FIGS. 4A-1 to 4A-2, and FIGS. 5A-1 to 5A-3, see also process step 1522 of FIG. 15 and the semiconductor-on-insulator structures 100.1B-100.5B shown in FIG. 1B, FIG. 2B, FIGS. 3B-1 to 3B-3, FIGS. 4B-1 to 4B-2, and FIGS. 5B-1 to 5B-3).

The additional processing at process step 632 of FIG. 6 or process step 1522 of FIG. 15 can include active semiconductor device formation. Specifically, an active semiconductor device (e.g., a FET or other device) can be formed such that it has at least one device component, which is in the device area 111 and which include at least one of the previously formed polycrystalline portions 162. In some embodiments, an active semiconductor device 110 formed at process step 632 of FIG. 6 or process step 1522 of FIG. 15 can be a multi-finger FET (e.g., for a low noise amplifier (LNA) or for a radio frequency (RF) switch). Formation of such a multi-finger FET (e.g., gate patterning, source/drain formation, etc.) can be performed so that the previously formed polycrystalline portion(s) 162 fall within or, optionally, encompass one or more of the source/drain regions (e.g., a shared source/drain regions 142/132 and/or 132/152 between adjacent FETs, as illustrated in the figures and described in detail above with regard to the various structure embodiments. Optionally, one or more additional semiconductor devices could be concurrently formed on the semiconductor layer 101 within one or more other design areas (e.g., within the design area 191) (not shown). Techniques for forming active semiconductor devices, including FETs (e.g., simple FETs, multi-finger FETs, etc.) and other types of active semiconductor devices, are well known art and, thus, the details have been omitted from this specification in order to allow the reader to focus on the salient aspects of the disclosed methods. The additional processing can also include, but is not limited to, dielectric layer deposition, middle of the line (MOL) contact formation (e.g., gate contact formation, source/drain contact 199 formation, etc.), etc. As discussed in detail above with regard to the semiconductor structure embodiments, one factor to consider during patterning of polycrystalline portion(s) 162 within source/drain regions of FETs and further during patterning of source/drain contacts 199 is that it may be preferrable to have source/drain contacts land on monocrystalline semiconductor material and not polycrystalline semiconductor material.

It should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and gallium nitride-based semiconductor materials. A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity or silicon (Si) to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of a semiconductor structure with one or more in-device high resistivity polycrystalline semiconductor elements. The semiconductor structure can be either a bulk semiconductor structure or a semiconductor-on-insulator structure (e.g., a silicon-on-insulator (SOI) structure). In any case, the semiconductor structure can include a semiconductor layer, which has a first surface and a second surface opposite the first surface. The semiconductor layer can also have a device area adjacent to the second surface and, within the device area, a monocrystalline portion and one or more polycrystalline portions, which extend vertically through the monocrystalline portion from the second surface toward the first surface. The semiconductor structure can further include an active semiconductor device. The active semiconductor device can include, amongst other features, a device component within the device area of the semiconductor layer and including at least one polycrystalline portion that extends vertically through the monocrystalline portion. The embodiments of the semiconductor structure can vary with regard to the type of structure (e.g., bulk or SOI), with regard to the type of active semiconductor device therein, as well as with regard to the number, size, shape, location, orientation, etc. of the polycrystalline portion(s) within the active semiconductor device. Also disclosed above are method embodiments for forming such a semiconductor structure.

What is claimed is:

1. A semiconductor structure comprising:
   a semiconductor layer having a first surface and a second surface opposite the first surface,
      wherein the semiconductor layer has a device area adjacent to the second surface and, within the device area, a monocrystalline portion and at least one polycrystalline portion extending through the monocrystalline portion from the second surface toward the first surface to a buried layer, and
      wherein the buried layer comprises a same material adjacent to the monocrystalline portion and the at least one polycrystalline portion; and
   an active semiconductor device comprising the monocrystalline portion and the at least one polycrystalline portion
   wherein, within the device area, the at least one polycrystalline portion comprises multiple polycrystalline portions that extend through the monocrystalline portion,
   wherein the active semiconductor device comprises a field effect transistor comprising, within the device area, alternating channel regions and source/drain regions,
   wherein each source/drain region that is positioned laterally between two channel regions comprises at least one of the multiple polycrystalline portions,
   wherein each of two source/drain regions that are on opposite sides of a channel region comprise a single polycrystalline portion of the multiple polycrystalline portions, and
   wherein the single polycrystalline portion has a square zig-zag pattern extending across a full width of the device area.

2. The semiconductor structure of claim 1, further comprising trench isolation regions in the semiconductor layer at the second surface and extending to the buried layer, wherein the device area extends laterally between the trench isolation regions,
wherein the semiconductor layer is a bulk semiconductor substrate further comprising:
an additional monocrystalline portion at the first surface; and
the buried layer comprising a buried polycrystalline portion between the additional monocrystalline portion and the device area and further extending laterally between and contacting the trench isolation regions.

3. The semiconductor structure of claim 1 wherein the at least one polycrystalline portion comprises a single polycrystalline portion that partially encompasses the source/drain region and is any of parallel to the channel region and perpendicular to the channel region.

4. The semiconductor structure of claim 1 wherein the at least one polycrystalline portion comprises a single polycrystalline portion that fully encompasses the source/drain region.

5. The semiconductor structure of claim 1 wherein each of two source/drain regions that are on opposite sides of a channel region comprise a same number of the multiple polycrystalline portions that are perpendicular to the channel region and aligned.

6. A semiconductor structure comprising:
a substrate;
an insulator layer on the substrate;
a semiconductor layer having a first surface immediately adjacent to the insulator layer and a second surface opposite the first surface;
trench isolation regions in the semiconductor layer extending from the second surface to the first surface, wherein the semiconductor layer has a device area extending laterally between the trench isolation regions and, within the device area, a monocrystalline portion and at least one polycrystalline portion extending through the monocrystalline portion from the second surface to the insulator layer at the first surface; and
an active semiconductor device comprising the monocrystalline portion and the at least one polycrystalline portion
wherein, within the device area, the at least one polycrystalline portion comprises multiple polycrystalline portions that extend through the monocrystalline portion,
wherein the active semiconductor device comprises a field effect transistor comprising, within the device area, alternating channel regions and source/drain regions,
wherein each source/drain region that is positioned laterally between two channel regions comprises at least one of the multiple polycrystalline portions,
wherein each of two source/drain regions that are on opposite sides of a channel region comprise a single polycrystalline portion of the multiple polycrystalline portions, and
wherein the single polycrystalline portion has a square zig-zag pattern extending across a full width of the device area.

7. The semiconductor structure of claim 6 wherein the at least one polycrystalline portion comprises a single polycrystalline portion that partially encompasses the source/drain region and is any of parallel to the channel region and perpendicular to the channel region.

8. The semiconductor structure of claim 6 wherein the at least one polycrystalline portion comprise a single polycrystalline portion that fully encompasses the source/drain region.

9. The semiconductor structure of claim 6 wherein each of two source/drain regions that are on opposite sides of a channel region comprise a same number of the multiple polycrystalline portions that are perpendicular to the channel region and aligned.

10. A method comprising:
providing a semiconductor layer having a first surface and a second surface opposite the first surface, wherein the semiconductor layer initially has a monocrystalline structure;
processing the semiconductor layer so that, within a device area at the second surface, the semiconductor layer has a monocrystalline portion and at least one polycrystalline portion extending through the monocrystalline portion from the second surface toward the first surface to a buried layer, wherein the buried layer comprises a same material adjacent to the monocrystalline portion and the at least one polycrystalline portion; and
forming an active semiconductor device comprising the monocrystalline portion and the at least one polycrystalline portion
wherein, within the device area, the at least one polycrystalline portion comprises multiple polycrystalline portions that extend through the monocrystalline portion,
wherein the active semiconductor device comprises a field effect transistor comprising, within the device area, alternating channel regions and source/drain regions,
wherein each source/drain region that is positioned laterally between two channel regions comprises at least one of the multiple polycrystalline portions,
wherein each of two source/drain regions that are on opposite sides of a channel region comprise a single polycrystalline portion of the multiple polycrystalline portions, and
wherein the single polycrystalline portion has a square zig-zag pattern extending across a full width of the device area.

11. The method of claim 10,
wherein the semiconductor layer is a bulk semiconductor substrate,
wherein the method further comprises forming trench isolation regions in the semiconductor layer at the second surface to define the device area, and
wherein the processing of the semiconductor layer is performed so that a buried polycrystalline portion for the buried layer is formed between an additional monocrystalline portion at the first surface and the device area and further between the trench isolation regions such that a first distance between the second surface and bottom surfaces of the trench isolation regions is less than a second distance between the second surface and an interface between the device area and the buried polycrystalline portion.

12. The method of claim 11,
wherein the first surface of the semiconductor layer is immediately adjacent to an insulator layer on a substrate,
wherein the trench isolation regions extend from the second surface to the first surface, and
wherein the processing of the semiconductor layer is performed so that the monocrystalline portion and the at least one polycrystalline portion extend from the second surface to the insulator layer at the first surface.

13. The method of claim 10,
wherein the processing of the semiconductor layer and the forming of the active semiconductor device are performed so that the at least one polycrystalline portion comprises a single polycrystalline portion that extends vertically through a source/drain region within the device area and is any of parallel to an adjacent channel region within the device area, perpendicular to an adjacent channel region within the device area, and fully encompassing the source/drain region.

* * * * *